United States Patent
Kumeno

(10) Patent No.: US 6,781,207 B2
(45) Date of Patent: Aug. 24, 2004

(54) SEMICONDUCTOR DEVICE AND MANUFACTURING METHOD THEREOF

(75) Inventor: Kazuyuki Kumeno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 70 days.

(21) Appl. No.: 10/101,974

(22) Filed: Mar. 21, 2002

(65) Prior Publication Data

US 2003/0107090 A1 Jun. 12, 2003

(30) Foreign Application Priority Data

Dec. 11, 2001 (JP) .................................. 2001-377623

(51) Int. Cl.$^7$ ............................................. H01L 29/772
(52) U.S. Cl. ........................ 257/377; 257/382; 257/384
(58) Field of Search ..................... 257/377, 69, 369, 257/371, 382, 384

(56) References Cited

U.S. PATENT DOCUMENTS

| | | | |
|---|---|---|---|
| 5,633,523 A | | 5/1997 | Kato |
| 5,837,601 A | * | 11/1998 | Matsumoto ................ 438/592 |
| 5,877,535 A | * | 3/1999 | Matsumoto ................ 257/369 |
| 5,977,591 A | * | 11/1999 | Fratin et al. ................ 257/344 |
| 6,180,519 B1 | * | 1/2001 | Kuroi et al. ................ 438/649 |
| 6,191,460 B1 | * | 2/2001 | Choi et al. ................ 257/393 |
| 6,489,664 B2 | * | 12/2002 | Re et al. ................ 257/538 |
| 6,586,837 B1 | * | 7/2003 | Suguro ................ 257/751 |
| 2001/0006832 A1 | * | 7/2001 | Bae et al. ................ 438/199 |
| 2001/0007368 A1 | * | 7/2001 | Yamazaki et al. ......... 257/369 |
| 2002/0042173 A1 | * | 4/2002 | Takamura ................ 438/199 |
| 2002/0093051 A1 | * | 7/2002 | Nohsoh et al. ............. 257/338 |
| 2003/0173625 A1 | * | 9/2003 | Choi ................ 257/369 |

FOREIGN PATENT DOCUMENTS

| | | |
|---|---|---|
| JP | 6-244369 | 9/1994 |
| JP | 7-86421 | 3/1995 |
| JP | 9-246541 | 9/1997 |
| JP | 10-12745 | 1/1998 |
| JP | 2001-77210 | 3/2001 |
| JP | 2001-210725 | 8/2001 |

OTHER PUBLICATIONS

Patent Abstracts of Japan, Publication No. 2000–138293, dated May 16, 2000.

* cited by examiner

*Primary Examiner*—George Fourson
*Assistant Examiner*—Joannie Adelle Garcia
(74) *Attorney, Agent, or Firm*—Westerman, Hattori, Daniels & Adrian, LLP

(57) ABSTRACT

When an arsenic ion (As$^+$) large in mass is injected, polysilicon films are covered with a fifth resist mask so as to cover an end of the resist mask covering the polysilicon films to form a PMOS forming region. Through this process, a silicide non-forming region is arranged not to overlap with a pn junction to prevent the silicide non-forming region from increasing in resistance.

20 Claims, 14 Drawing Sheets

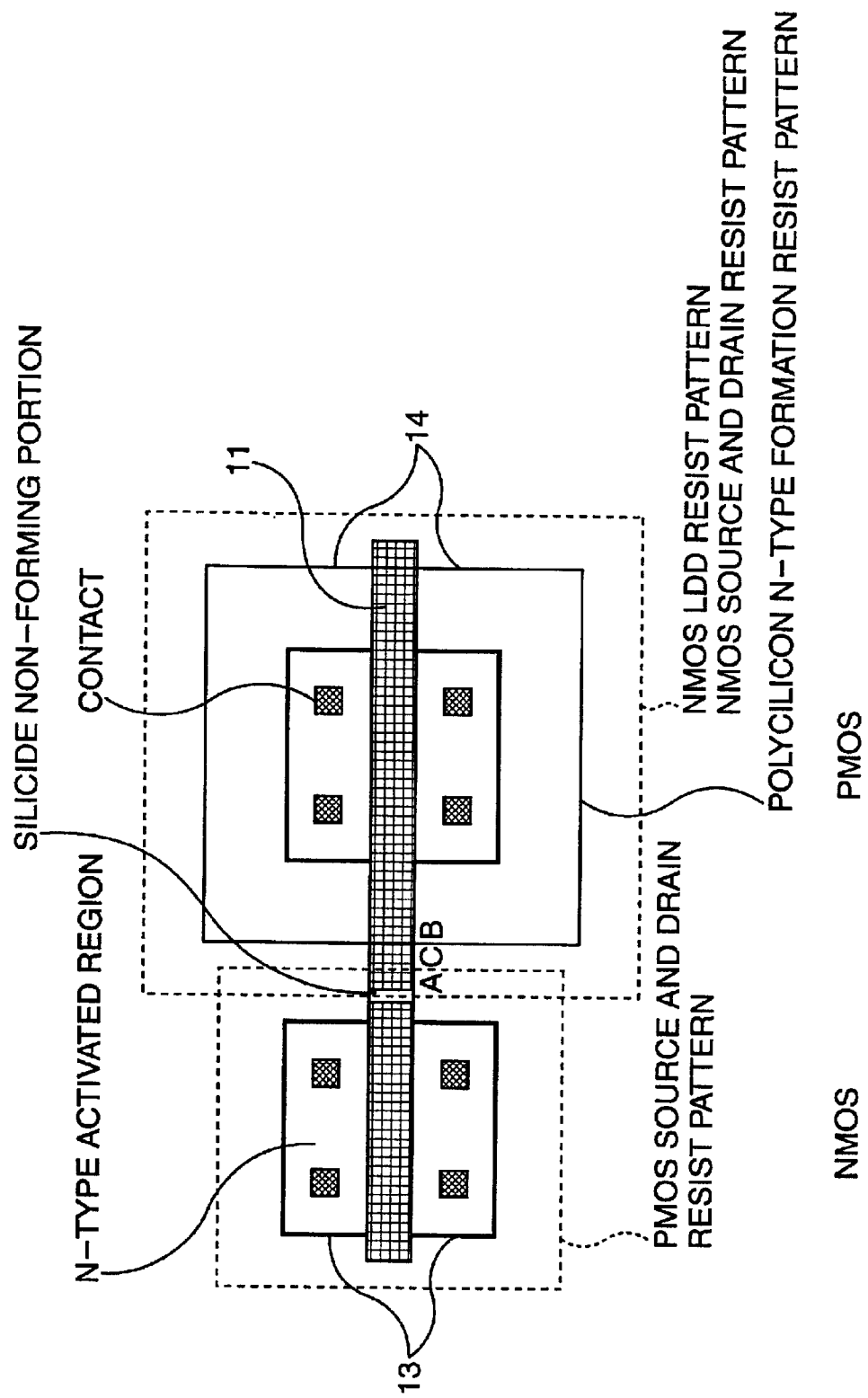

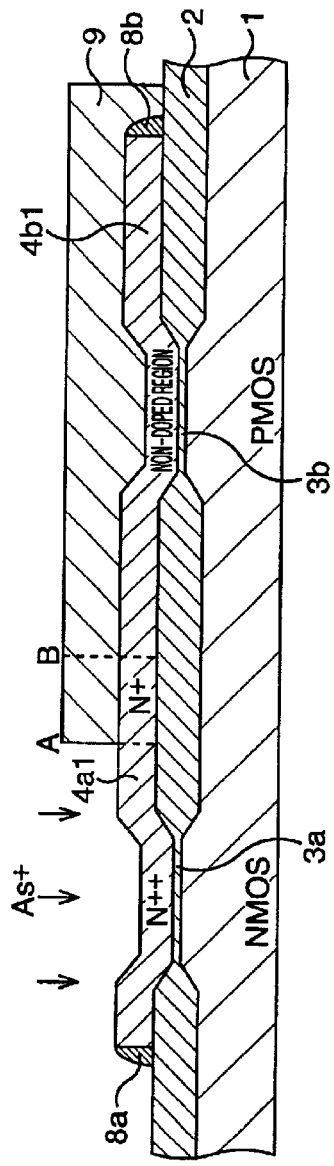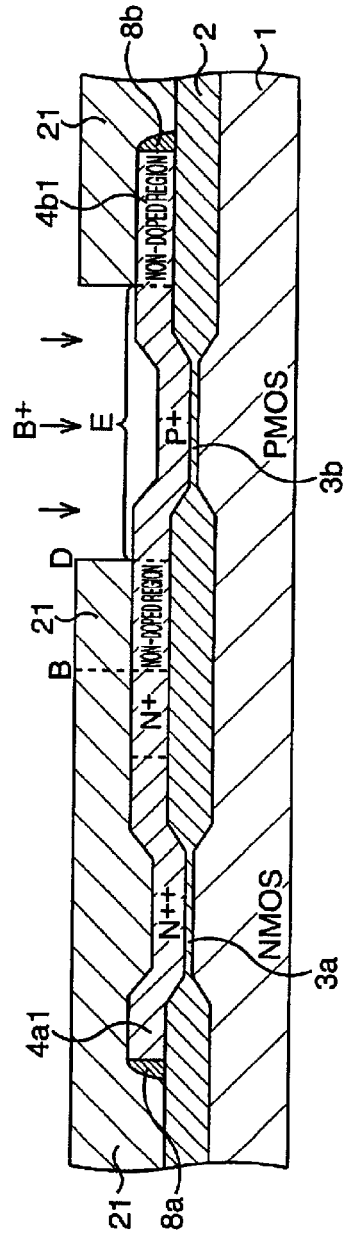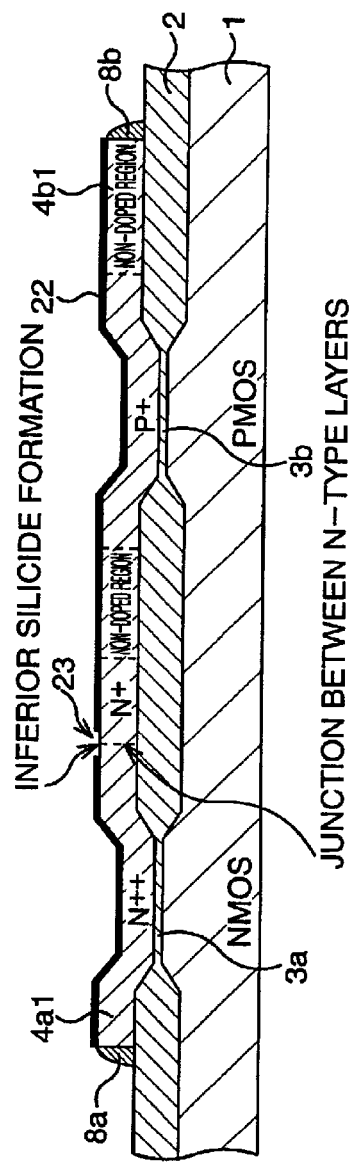
FIG. 5A
FIG. 5B
FIG. 5C

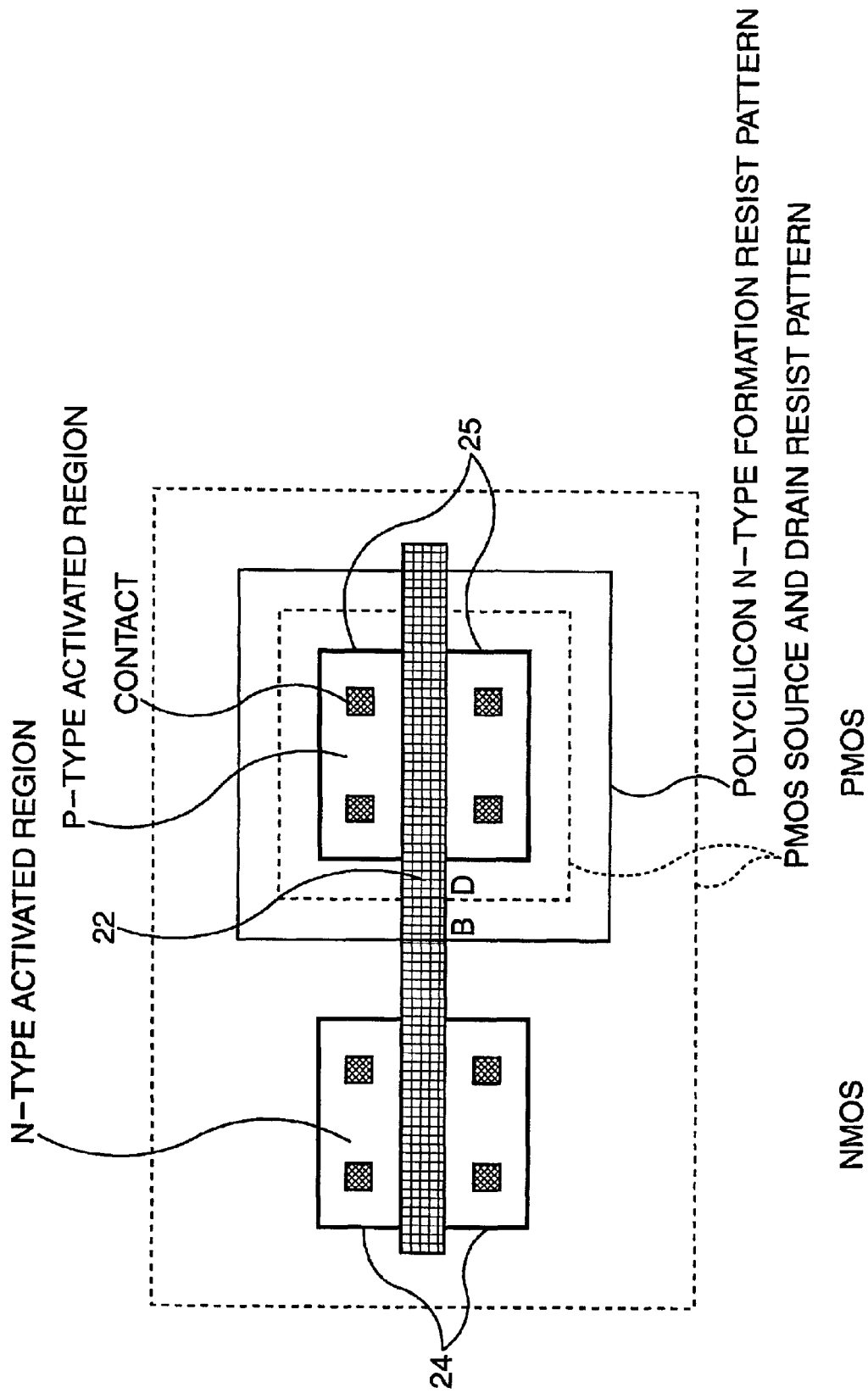

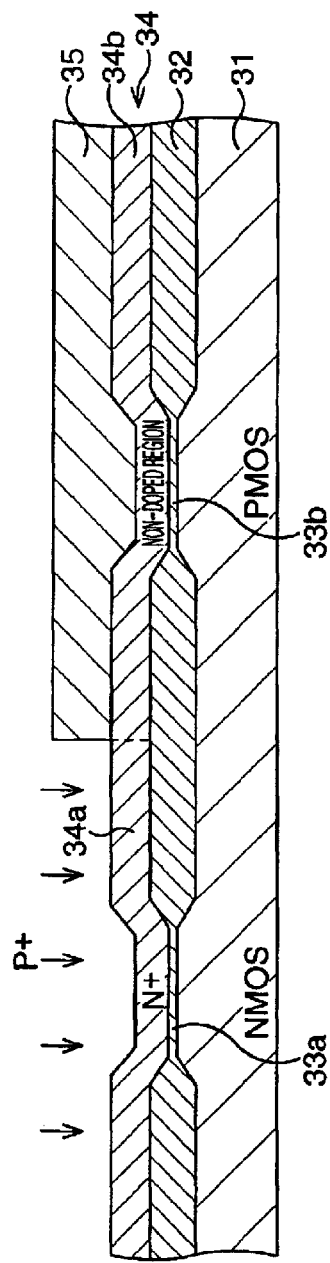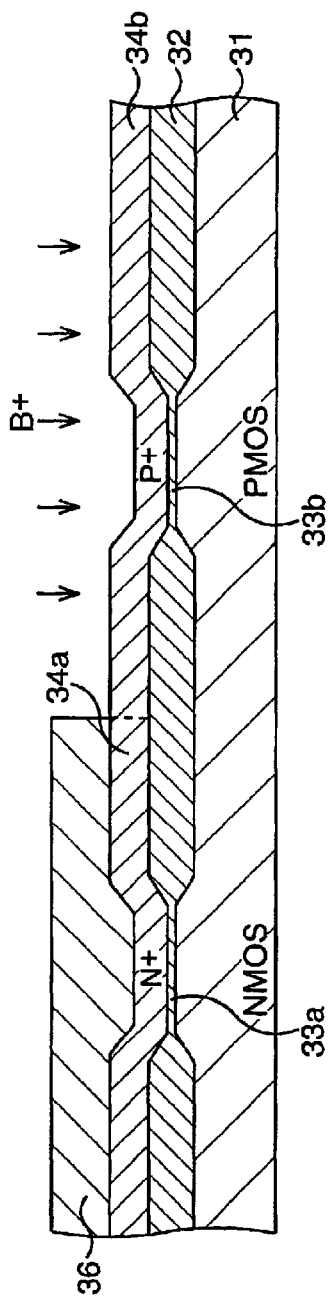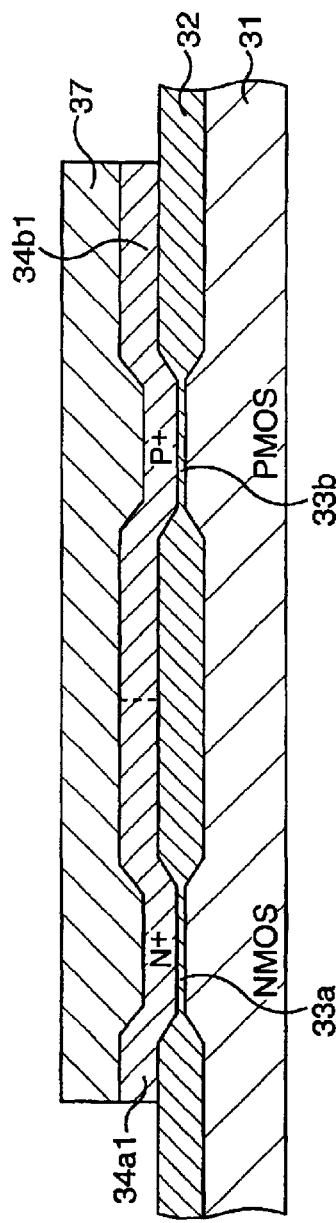

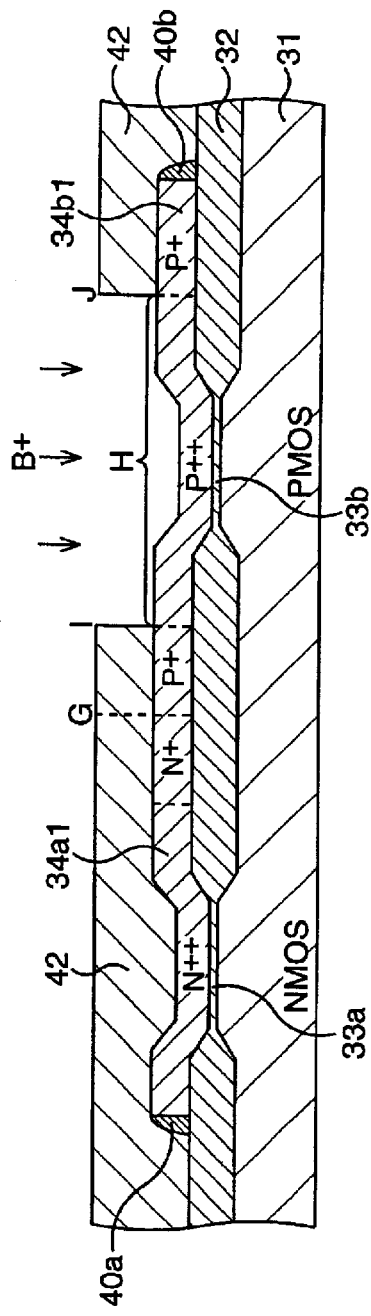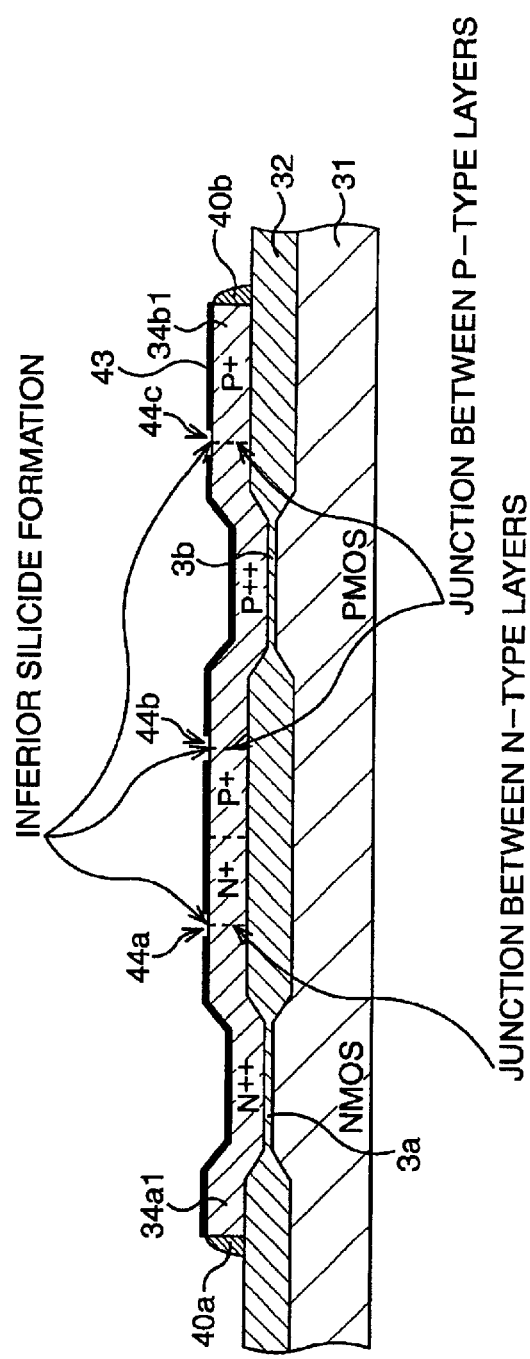
FIG. 10A
FIG. 10B

SEMICONDUCTOR DEVICE AND MANUFACTURING METHOD THEREOF

CROSS-REFERENCE TO RELATED APPLICATIONS

This application is based upon and claims priority of Japanese Patent Application No. 2001-377623, filed on Dec. 11, 2001, the contents being incorporated herein by reference.

BACKGROUND OF THE INVENTION

1. Field of the Invention

The present invention relates to a semiconductor device and a manufacturing method thereof, and, in particular, the present invention is best suited when applied to a semiconductor device provided with a gate electrode including silicide.

2. Description of the Related Art

In a system LSI of late years, in order to lower the resistance of wiring connecting between polysilicon gate electrode and element, a laminated structure of polysilicon and silicide is adopted, and a dual structure in which a gate of NMOS transistor is an N-type and a gate of PMOS transistor is a P-type is adopted.

FIGS. 13A, 13B, and 13C, and FIGS. 14A, and 14B are diagrammatic sectional views showing a manufacturing method of a conventional CMOS transistor adopting the above-described dual gate structure in the order of its processes.

As shown in FIG. 13A, after forming a field oxide film 72 and gate oxide films 73a and 73b on a silicon substrate 71, a non-doped polysilicon film is laminated. Then, a resist mask 75 is formed in a region to form a gate and the non-doped polysilicon film is patterned using the resist mask 75 as a mask to form a polysilicon film 74 for forming the gate.

Then, as shown in FIG. 13B, the resist mask 75 is removed, a resist mask 76 is newly formed on the polysilicon film 74 which is positioned in a PMOS forming region, and ion implantation with an arsenic ion ($As^+$) is performed using the resist mask 76 as a mask.

Then, as shown in FIG. 13C, after forming an insulation film to cover the polysilicon film 74 into which the arsenic ion ($As^+$) is injected, anisotropy etching is performed to form side wall spacers 77a and 77b on the side walls of the gate electrode. Then, the surface of polysilicon film 74 in the PMOS forming region is covered with a resist mask 78, and an arsenic ion ($As^+$) is injected into an NMOS side to form source and drain regions in high concentration in the NMOS forming region.

Then, as shown in FIG. 14A, the surface of polysilicon film 74 in the NMOS forming region is covered with a resist mask 79, and a boron ion ($B^+$) is injected into the PMOS side to form source and drain regions in high concentration in the PMOS forming region.

Then, as shown in FIG. 14B, a silicon substrate 71 is heated to activate the impurity injected with the ions. Then, silicide 80 is formed in the gate electrode, and source and drain regions using a high melting point metal.

The resist masks 76 to 79 which are used for formation of a CMOS transistor as described above are generally made of a polymer compound.

However, when ion implantation is performed with a resist mask formed with the polymer compound as a mask, carbide which composes the resist masks 76 to 79 is driven into the surface of the polysilicon film 74 positioned in the edge portion of the resist mask.

Thus-driven carbide can not be removed by resist ashing and washing. Therefore, as shown in FIG. 14B, silicide is considered not to be formed in the regions 81a and 81b where the carbide remains, due to the inhibition of silicide formation, which is disadvantageous in that a semiconductor device can not perform a predetermined operation.

Accordingly it is conceivable to perform ion implantation after the silicon oxide film is laminated on the polysilicon film formed on the semiconductor substrate, and then the silicon oxide film is removed to form silicide, as described in Japanese Patent Laid-opened Official Gazette 2000-138293.

However, there are following disadvantages in the technology described in Japanese Patent Laid-opened Official Gazette 2000-138293.

First, a process to grow the silicon oxide film is required, which results in increase in the manufacturing cost.

Second, since ion implantation is performed through the silicon oxide film, it needs to increase ion implantation energy. Accordingly, diffusion layers of source and drain are formed deep inside the semiconductor substrate, which makes it difficult to realize formation of the transistor in fine size.

SUMMARY OF THE INVENTION

In view of the above disadvantages, an object of the present invention is to provide a semiconductor device and a manufacturing method thereof which make it possible to perform a normal operation with low resistant wiring while forming silicide on polysilicon, and to realize reduction of cost and formation of the semiconductor device in a fine size.

The present invention is provided with the following embodiments to solve the above disadvantages.

In a first embodiment of the present invention, a semiconductor device comprises a semiconductor film formed above a semiconductor substrate and a silicide film formed on the above-described semiconductor film, wherein at least one out of the same conductive semiconductor films formed above the semiconductor substrate is connected including two or more differences in concentration along the surface of the semiconductor substrate.

More concretely, it is characterized in that a region where the silicide film is not formed is on a region having the above-described difference in concentration.

With such a formation, the region where the silicide film is not formed and the junction of different conductive-type semiconductor films are not overlapped.

In the first embodiment, the above-described semiconductor film comprises a first conductive-type semiconductor film having two or more differences in concentration and a second conductive-type semiconductor film different from the first conductive-type, wherein a region of low concentration on the first conductive-type semiconductor film is connected to the second conductive-type semiconductor film. Then, it is preferable because the region where the silicide film is not formed does not overlap with the junction of different conductive-type semiconductor films when forming a first conductive-type transistor.

Furthermore, in the first embodiment, the above-described semiconductor film specifically comprises the first conductive-type semiconductor film having two or more differences in concentration, the second conductive-type semiconductor film different from the first conductive-type, and a non-doped semiconductor film in which an impurity is not doped, wherein the non-doped semiconductor film is connectedly sandwiched between the region of low concentration in the first conductive-type semiconductor film and the second conductive-type semiconductor film along the surface of the semiconductor substrate. Then, it is more preferable because the impurity of the first conductive-type and the impurity of the second conductive-type can be injected in any concentration.

Still further, in the first embodiment, the above-described semiconductor film concretely comprises the first conductive-type semiconductor film having two or more differences in concentration, and the second conductive-type semiconductor film having two or more differences in concentration and different from the first conductive-type, wherein a region of low concentration in the first conductive-type semiconductor film is connected with a region of low concentration in the second conductive-type semiconductor film. Then, it is preferable because the silicide film non-forming region does not overlap with the junction of different conductive-type semiconductor films when forming a second conductive-type transistor.

Yet further, in the first embodiment, there exists an impurity in high concentration of the semiconductor film, which is heavier in mass than the impurity existing in the region of low concentration in the semiconductor film.

Furthermore, in the first embodiment, a semiconductor device comprises an insulation film formed on the surface of the semiconductor substrate and diffusion layers formed in the semiconductor substrate in a manner to sandwich a lower region of the same conductive-type semiconductor film so as to form a transistor in which the semiconductor film serves as a gate, the insulation film serves as a gate insulation film, and the diffusion layers serve as a source and a drain.

Still further, in the first embodiment, the semiconductor film is, for instance, a polysilicon film.

In a second embodiment of the present invention, a manufacturing method of a semiconductor device comprises: a first step of forming a semiconductor film above a semiconductor substrate; a second step of forming a first mask layer covering a partial region of the semiconductor film; a third step of forming a first conductive-type semiconductor film in said semiconductor film by injecting a first impurity in a first conductive-type into the semiconductor film using said first mask layer as a mask; a fourth step of removing the first mask layer; a fifth step of forming a second mask layer covering a partial region of the first conductive-type semiconductor film and a semiconductor film different from the first conductive-type semiconductor film to include the boundary region between the first conductive-type semiconductor film and a semiconductor film different from the first conductive semiconductor film; a sixth step of forming the first conductive-type semiconductor film of high concentration and the first conductive-type semiconductor film of low concentration by injecting the second impurity of the same conductive type as said first conductive type, composing of a heavier element in mass than said first impurity into said semiconductor film, using said second mask layer as a mask; a seventh step of removing the second mask layer; and an eighth step of forming silicide on the semiconductor film, so that the silicide non-forming region does not overlap with the junction of semiconductor films having different conductive-types.

In a third embodiment of the present invention, in manufacturing a semiconductor device by forming a silicide film on a gate semiconductor film after forming the gate semiconductor film in which two different conductive-type semiconductor films are in junction with each other above a semiconductor substrate, the manufacturing method of the semiconductor device comprises: a first step of forming a region of low concentration in the same conductive-type semiconductor film by injecting an impurity ion of a light element in at least one semiconductor film of the same conductive type out of the gate semiconductor films; a second step of forming a region of high concentration in the same conductive-type semiconductor film by injecting an impurity ion of a heavy element heavier in mass than the light element into a lower concentration region side with respect to the junction between the two different conductive-type semiconductor films out of the same conductive-type semiconductor films; and a third step of forming a silicide film on the junction between the two different conductive-type semiconductor films, so that the silicide film non-forming region does not overlap with the junction between the two different conductive-type semiconductor films.

BRIEF DESCRIPTION OF THE DRAWINGS

FIG. 3 indicates the first embodiment of the present invention and is a diagrammatic plan view showing the semiconductor device manufactured by the processes shown in FIGS. 1A, 1B and 1C and FIGS. 2A, 2B and 2C seen from above;

FIGS. 5A, 5B and 5C indicate the second embodiment of the present invention and are diagrammatic sectional views showing a manufacturing method of the semiconductor device following to the processes in FIGS. 4A, 4B, and 4C in the order of its processes;

FIG. 7 indicates the first embodiment of the present invention and is a second diagrammatic plan view showing the semiconductor device manufactured by the processes shown in FIGS. 4A, 4B and 4C and FIGS. 5A, 5B and 5C seen from above;

FIGS. 8A, 8B and 8C indicate a third embodiment of the present invention and are diagrammatic sectional views showing a manufacturing method of a semiconductor device in the order of its processes;

FIGS. 10A and 10B indicate the third embodiment of the present invention and are diagrammatic sectional views showing a manufacturing method of the semiconductor device following to the processes in FIGS. 9A, 9B and 9C in the order of its processes;

DETAILED DESCRIPTION OF THE PREFERRED EMBODIMENTS

Conditions for Realizing Embodiments

Before explaining a detailed description of embodiments of a semiconductor device and a manufacturing method thereof according to the present invention, the fact that the inventors of the present invention have found now to realize the present invention will be explained first.

The inventors of the present invention studied the effect of different ions injected into polysilicon on the silicide formed thereafter on the polysilicon, in detail. As a result, the following important fact was found.

That is, the inventors of the present invention have found that the silicide formed on polysilicon depends largely on the kinds of the ion injected, ion implantation energy, and dose amount, and especially, the silicide formation is extremely difficult when an arsenic ion ($As^+$) is used, while the inhibition of the silicon formation can not be recognized to the extent of high dose when a phosphorus ion ($P^+$) or a boron ion ($B^+$) is used, and have ascertained that the formation of silicide is sometimes easy and sometimes difficult according to the kind of ions selected.

Describing in more detail, when the arsenic ion ($As^+$) is injected into polysilicon under the condition of 10 keV, $6\times10^{13}$ $cm^{-2}$ to form silicide, perfect silicide can not be formed on polysilicon and a silicide non-forming region is developed.

On the other hand, when ion implantation on polysilicon is performed with a phosphorus ion ($P^+$) under the condition of 20 keV, $4\times10^{15}$ $cm^{-2}$, or with a boron ion ($B^+$) under the condition of 7 keV, $4\times10^{15}$ $cm^{-2}$, the silicide non-forming region is not developed on polysilicon.

Thus, the inventors of the present invention found that the silicide formation is apt to be hindered when ion implantation is performed using an element of relatively large in the atomic number (that is, large in mass), and, conversely, the silicide formation is easy when the ion implantation is performed using an element of small in atomic number (that is, small in mass).

Each embodiment of the semiconductor device and the method for manufacturing thereof according to the present invention utilizing the characteristics found as above will be explained.

First Embodiment

A fist embodiment of the semiconductor device and the method for manufacturing thereof according to the present invention will be explained referring to attached drawings.

FIGS. 1A, 1B and 1C, and FIGS. 2A, 2B and 2C are diagrammatic sectional views showing a manufacturing method of a semiconductor device according to the present embodiment in the order of its processes, and FIG. 3 is a diagrammatic plan view showing the semiconductor device manufactured by the processes shown in FIGS. 1A, 1B and 1C and FIGS. 2A, 2B and 2C in the process order seen from above.

Figure 1A:
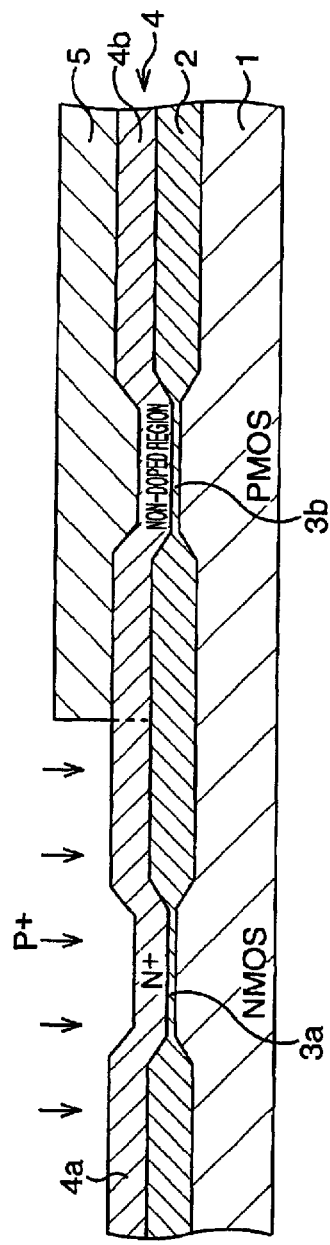
FIGS. 1A, 1B and 1C indicate a first embodiment of the present invention and are diagrammatic sectional views showing a manufacturing method of a semiconductor device in the order of its processes.

First, as shown in FIG. 1A, after forming a gate insulation film made of, for instance, $SiO_2$ film, using a thermal oxidation method or the like on an element forming region 1 of a semiconductor substrate, a field insulation film 2 is formed in an element separation region using a LOCOS method or the like. Through the process, a gate insulation film 3a in an NMOS forming region, and a gate insulation film 3b in a PMOS forming region separated by the field insulation film 2 are formed.

Then, a polysilicon film 4 is laminated on the gate insulation films 3a and 3b, and the field insulation film 2 by a method such as pyrolysis of $SiH_4$ gas in a nitrogen gas atmosphere.

Then, a window for an n-type formation of a gate electrode is formed by covering a PMOS forming region 4b of the polysilicon film 4 with a first resist mask 5 as a first mask layer, and a phosphorus ion ($P^+$) as a first impurity is injected under the condition of, for instance, 20 KeV, $4\times10^{15}$ $cm^{-2}$ from above.

Through this process, the NMOS forming region 4a of the polysilicon gate film 4 is converted into an n-type in a concentration of about $2.5\times10^{20}$ $cm^{-3}$. Then, the first resist mask 5 is exfoliated and the exfoliated portion is washed.

It should be noted that an n-type formation pattern data (a polysilicon n-type formation resist pattern in FIG. 3) to form the polysilicon film 4 into an n-type in covering the first resist mask 5 can be created by only shifting n-well data so that it is easily created automatically.

Figure 1B:
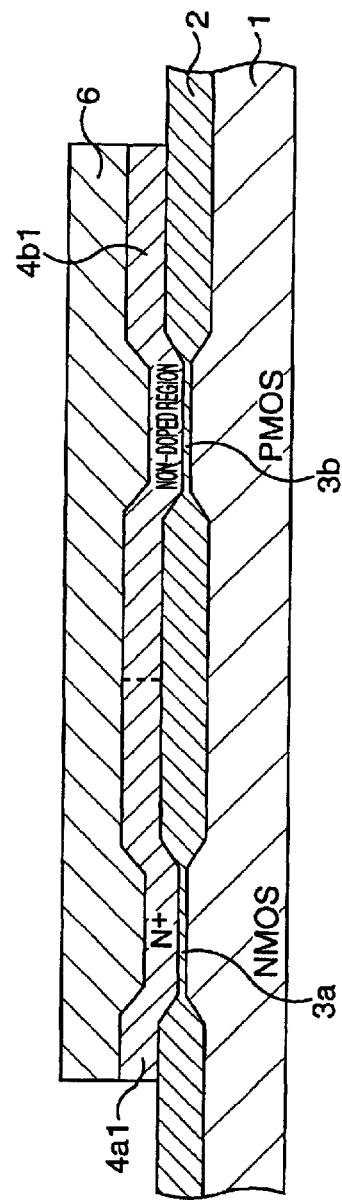

Next, as shown in FIG. 1B, a gate forming region of the polysilicon film 4 including the NMOS forming region 4a of the polysilicon gate film 4, and the PMOS forming region 4b of the polysilicon gate film 4 where no ion is doped is covered with a second resist mask 6, and the polysilicon film 4 is patterned using, for instance, photolithography and dry etching to form gate electrode forming layers 4a1 and 4b1. Then, the second resist mask 6 is exfoliated and washed.

Figure 1C:
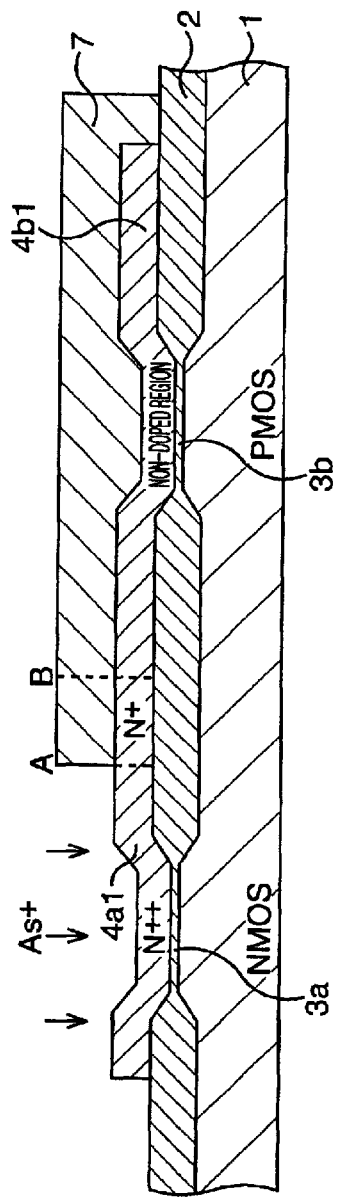

Next, as shown in FIG. 1C, in order to form an LDD (Lightly Doped Drain) in the NMOS forming region, a non-doped region 4b1 and a partial region of an n-type forming region 4a1 are covered with a third resist mask 7 as a second mask layer so as to include a boundary portion between the region 4b1 where ions in the gate electrode forming layers 4a1 and 4b1 are not doped (hereinafter referred to a non-doped region) and an n-type formed region 4a1 (hereinafter referred to as an n-type forming region).

More concretely, an NMOSLDD ion implantation window to form an LDD in the NMOS forming region (an end A of the third resist mask 7 on the NMOS forming region side) is arranged to position between an n-type formation window of the gate electrode (an end B of the first resist mask 5 on the NMOS forming region side) and the NMOS gate electrode (an end of the polysilicon film 4 positioned on the gate insulation film 3a on the PMOS forming region side).

At this time, the distance between the n-type formation window of the gate electrode (the end B of the first resist mask) and the NMOSLDD forming ion implantation window (the end A of the third resist mask 7) is preferably about 0.3 µm in the case of, for instance, 0.25 µm device.

Then, an arsenic ion ($As^+$) as a second impurity is injected from above under the condition of, for instance, 10 KeV, $3 \times 10^{14}$ $cm^{-2}$ to perform ion implantation for LDD formation of an NMOS transistor.

The reason to use the arsenic ion ($As^+$) for forming the LDD as above is because it is necessary to form a shallow junction in the semiconductor substrate 1. In addition, the use of the arsenic ion ($As^+$) gives the advantage of not only making the ion implantation energy low, but also making the element to be low resistant so that the drive capacity can be improved.

An implantation window data for the LDD (the NMOSLDD resist pattern in FIG. 3) to form the above-described NMOSLDD ion implantation window can be automatically created by shifting the n-type formation pattern data (the polysilicon n-type formation resist pattern in FIG. 3) of the gate electrode.

Then, the third resist mask 7 is exfoliated and the exfoliated portion is washed.

Figure 2A:
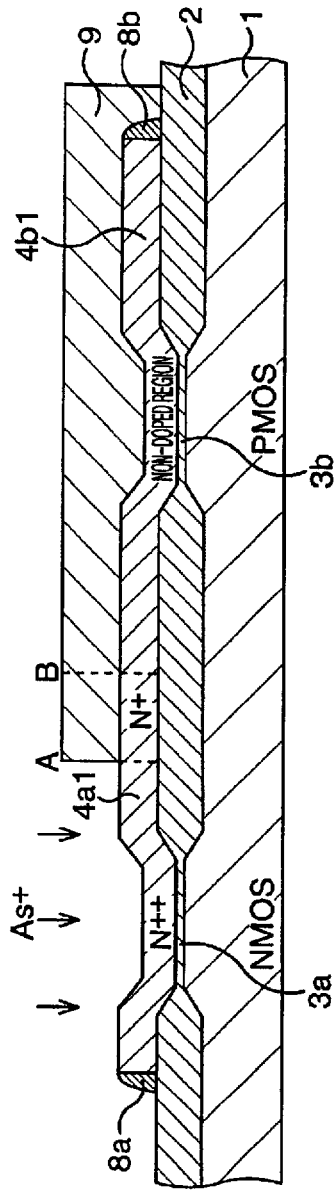
FIGS. 2A, 2B and 2C indicate the first embodiment of the present invention and are diagrammatic sectional views showing a manufacturing method of the semiconductor device following to the processes in FIGS. 1A, 1B and 1C in the order of its processes.

Next, as shown in FIG. 2A, after covering the top faces and side faces of the gate electrode forming layers 4a1 and 4b1, and forming an insulation film, anisotropy etching and the like are applied to form side wall spacers 8a and 8b on side walls of the gate electrode forming layers 4a1 and 4b1.

Then, in order to form source and drain regions in the NMOS forming region, a non-doped region 4b1 and a partial region of the n-type forming region 4a1 are covered with a fourth resist mask 9 as a fourth mask layer so as to include a non-doped region 4b1 of the gate electrode forming layers 4a1 and 4b1, and a boundary portion between the non-doped region 4b1 and the n-type forming region 4a1.

More concretely, an end A of the fourth resist mask 9 on the NMOS forming region side is managed to position between an end of the n-type formation window of the gate electrode (an end B of the first resist mask 5 on the NMOS forming region side) and the NMOS gate electrode (an end of the polysilicon film 4 positioned on the gate insulation film 3a on the PMOS forming region side) in a similar manner to the case of NMOSLDD ion implantation described above.

At this time, the distance between the n-type formation window of the gate electrode (the end B of the first resist mask 5) and the NMOS source and drain forming ion implantation window (the end A of the fourth resist mask 9) is preferably about 0.3 µm in the case of, for instance, 0.25 µm device.

Then, an arsenic ion ($As^+$) as a fourth impurity is injected from above under the condition of, for instance, 40 KeV, $2 \times 10^{15}$ $cm^{-2}$. Through this process, a source region and a drain region in high concentration (NMOS LDD source and drain 13 in FIG. 3) are formed in the NMOS forming region of the semiconductor substrate.

The reason of using the arsenic ion ($As^+$) to form the source region and the drain region is because the ion implantation energy required can be small, and the element can be made low resistant so that the drive capacity can be improved.

Thus, the difference between the ion concentration $N^+$ in a region covered with the fourth resist mask 9 and the ion concentration $N^{++}$ in a region not covered with, in the n-type forming region 4a1 of the gate electrode forming layers 4a1 and 4b1 is about $1.5 \times 10^{20}$ $cm^{-3}$.

The NMOS source and drain formation implantation window data (the NMOS source and drain resist pattern in FIG. 3) to form source and drain regions in the NMOS forming region is the same as the LDD implantation window data (the NMOSLDD resist pattern in FIG. 3) to form the NMOSLDD ion implantation window.

Then, the fourth resist mask 9 is exfoliated and the exfoliated portion is washed.

Figure 2B:
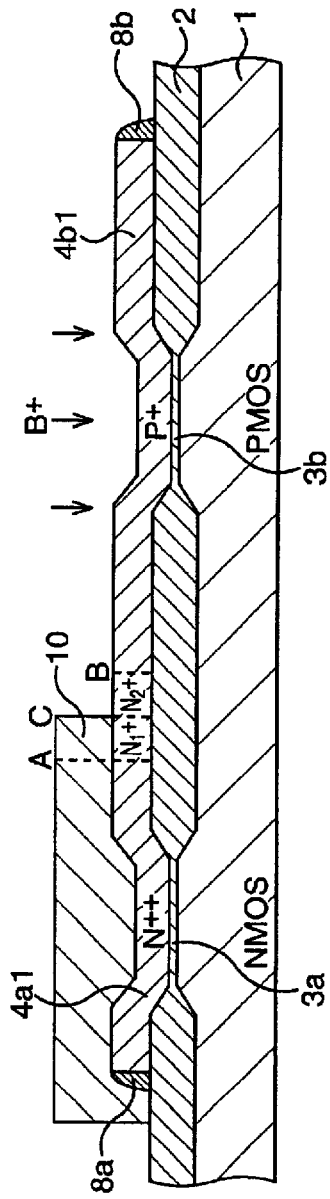

Next, as shown in FIG. 2B, in order to form source and drain regions in the PMOS forming region, an n-type forming region 4a1 excluding a region adjacent to the non-doped region 4b1 is covered with a fifth resist mask 10 as a third mask layer.

More concretely, an end C of the fifth resist mask 10 on the PMOS forming region is arranged to position between the n-type formation window (the end B of the first resist mask 5 on the NMOS forming region side) of the gate electrode and the NMOS gate electrode (an end of the polysilicon film 4 positioned on the gate insulation film 3a on the PMOS forming region side) in a similar manner to the case of NMOSLDD ion implantation described above.

Then, a boron ion ($B^+$) as a third impurity is injected from above under the condition of, for instance, 7 KeV, $2 \times 10^{15}$ $cm^{-2}$. Through this process, a non-doped region 4b1 is formed into a p-type (hereinafter referred to express the p-type non-doped region as a p-type forming region), and at the same time, a source region and a drain region in high concentration (PMOS LDD source and drain 14 in FIG. 3) are formed in the PMOS forming region of the semiconductor substrate.

It should be noted that the implantation of the boron ($B^+$) is performed with an ion implantation amount less than the arsenic ion implantation amount ($4 \times 10^{15}$ $cm^{-2}$) for forming the NMOS forming region 4a shown in FIG. 1A. This is because the n-type forming region not covered with the fifth resist mask 10 is not to be converted into a p-type.

The difference between the ion concentration $N1^+$ in a region covered with the fifth resist mask 10 and the ion concentration $N2^+$ in a region not covered with, in the region covered with the fourth resist mask 9 shown in FIG. 2A is about $1 \times 10^{20}$ $cm^{-3}$.

It should be noted that the PMOS source and drain formation implantation window data (the PMOS source and drain resist pattern in FIG. 3) to form the source and drain regions in the above-described PMOS forming region can be automatically created by shifting the n-type pattern data of the above-described gate electrode (the polysilicon n-type formation resist pattern in FIG. 3), similar to the above-described LDD implantation window data.

Figure 2C:
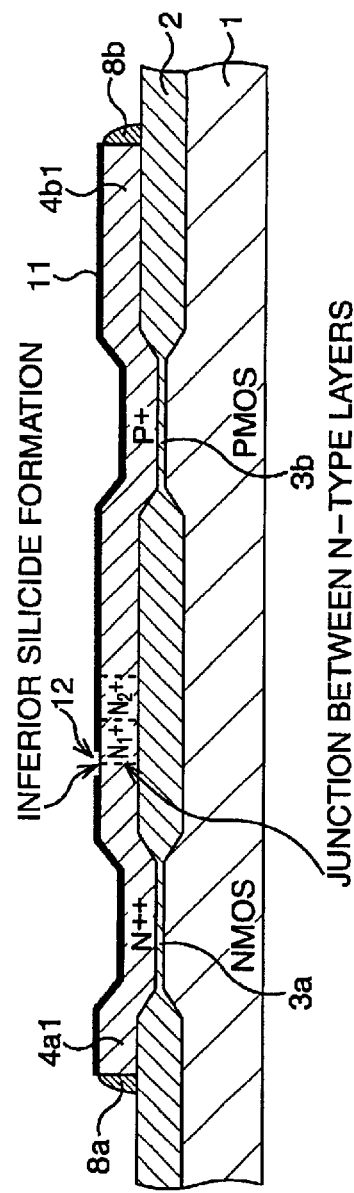

Next, as shown in FIG. 2C, an ion-injected impurity is activated by heating an element forming region 1 of the semiconductor substrate. Then, silicide 11 is formed in the gate electrode and the source and drain regions using a high melting point metal.

At this time, since carbide is driven into the surface of the polysilicon film positioned at an end A of the third and the fourth resist masks 7 and 9 by implantation of an arsenic ion ($As^+$) shown in FIG. 1C and FIG. 2A, silicide 11 is not formed on this portion.

However, when a semiconductor device in a dual gate structure is formed by the method according to the present embodiment, a silicide non-forming region 12 where the above-described silicide 10 is not formed is formed in the vicinity of the central portion of n-type region 4a1 of the gate electrode forming layers 4a1 and 4b1.

Accordingly, the silicide non-forming region 12 can be arranged not to overlap with a pn junction of the gate electrode forming layers 4a1 and 4b1, and a portion where the above-described silicide non-forming portion can be connected with polysilicon resistance in concentration of $1 \times 10^{20}$ cm$^{-3}$.

Thus, in the present embodiment, since the silicide non-forming region 12 is formed on the n-type forming region 4a1 of the gate electrode forming layers 4a1 and 4b1, so that the silicide non-forming region 12 does not overlap with the pn junction of the gate electrode forming layers 4a1 and 4b1, and the silicide film 11 is formed on the pn junction, a parasitic diode consisting of the pn junction is not formed on the gate electrode, which prevents the silicide non-forming region 12 from increasing in resistance.

Owing to this structure, such a process as in the prior art to form a silicon oxide film on the polysilicon film is not required, and a semiconductor device in a dual gate structure can be produced at a lower cost than the cost required in the prior art.

In addition, since the necessity of forming the silicon oxide film is disappeared, the ion implantation energy needs not to be large. Accordingly, the semiconductor device of the present invention can be made finer than the semiconductor device in the prior dual structure.

Second Embodiment

A second embodiment of the semiconductor device and the method for manufacturing thereof according to the present invention will be explained next.

Figure 6:
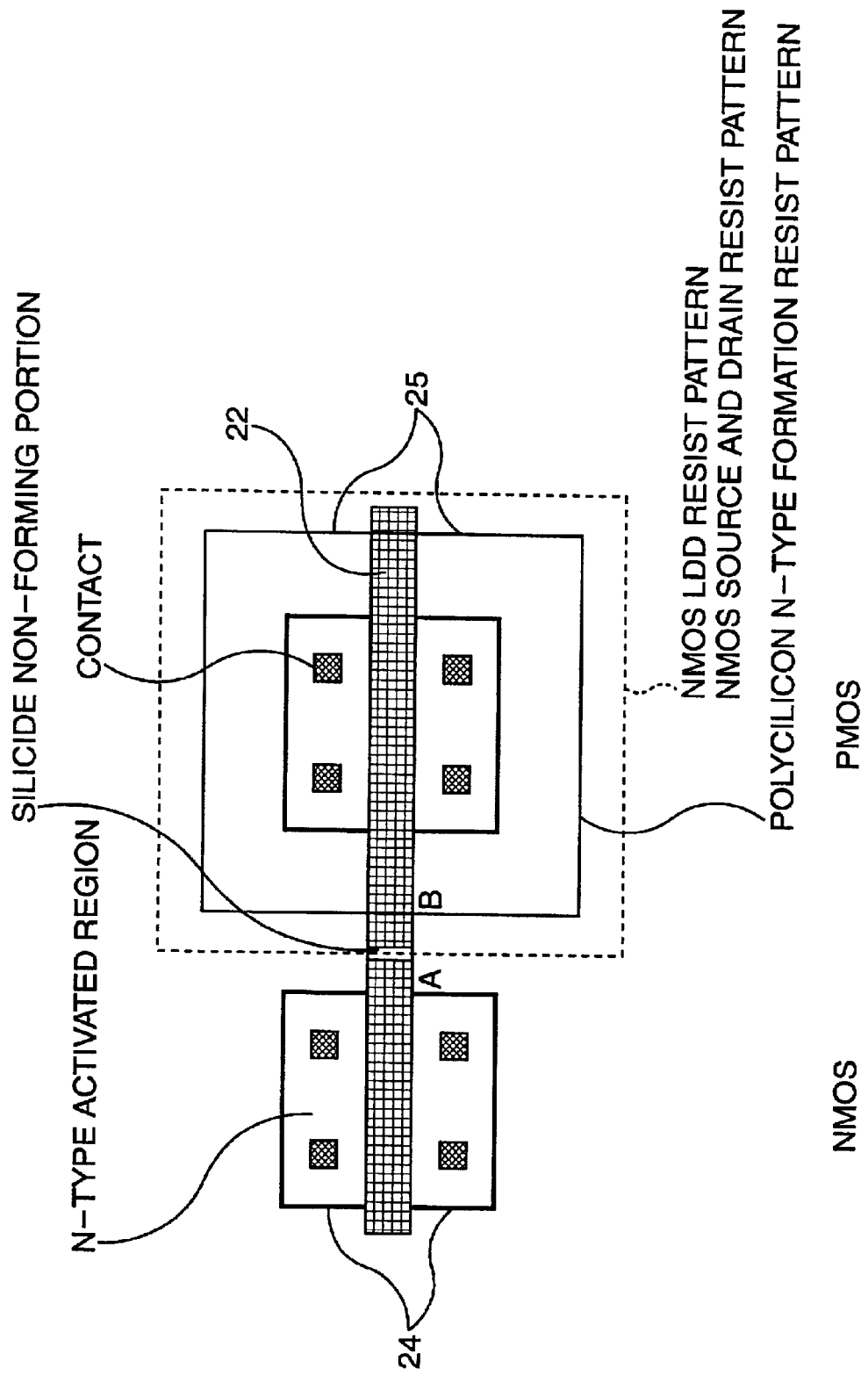
FIG. 6 indicates the first embodiment of the present invention and is a first diagrammatic plan view showing the semiconductor device manufactured by the processes shown in FIGS. 4A, 4B and 4C and FIGS. 5A, 5B and 5C seen from above.

FIGS. 4A, 4B and 4C, and FIGS. 5A, 5B and 5C are diagrammatic sectional views showing a manufacturing method of a semiconductor device according to the present embodiment in the order of its processes. FIG. 6 and FIG. 7 are diagrammatic plan views showing the semiconductor device manufactured by the processes shown in FIGS. 4A, 4B and 4C and FIGS. 5A, 5B and 5C in the process order seen from above.

Since the method for manufacturing the semiconductor device of the present embodiment differs in a portion for forming a fifth resist mask 10 from the method for manufacturing the semiconductor device in the above-described first embodiment, the same portions as those in the first embodiment are given the same symbols and numerals and a detailed explanation thereof will be omitted.

Figure 4A:
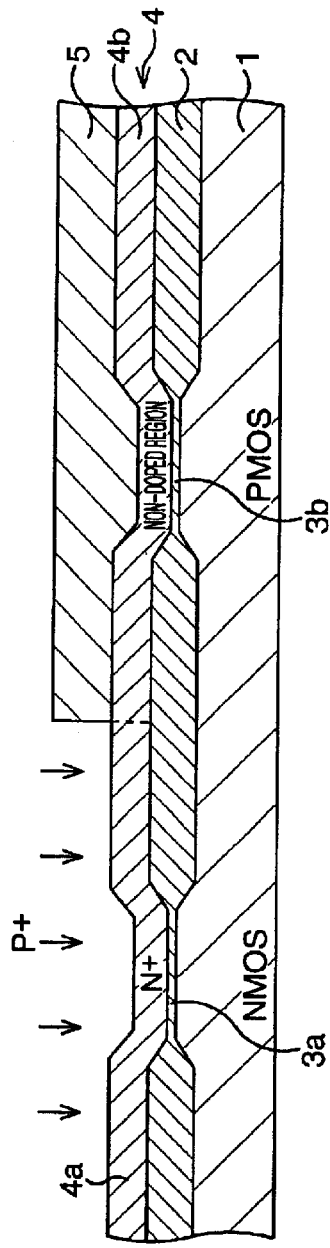
FIGS. 4A, 4B and 4C indicate a second embodiment of the present invention and are diagrammatic sectional views showing a manufacturing method of a semiconductor device in the order of its processes.

First, as shown in FIG. 4A, after a gate insulation film is formed on an element forming region 1 of a semiconductor substrate, a field insulation film 2 is formed to separate a gate insulation film 3a of an NMOS forming region from a gate insulation film 3b of a PMOS forming region.

Then, after a polysilicon film 4 is laminated on the gate insulation films 3a and 3b, and the field insulation film 2, an n-type formation window of the gate electrode is formed, covering a PMOS forming region 4b of the polysilicon film 4 with a first resist mask 5.

Then, a phosphorus ion (P$^+$) is injected under the condition of, for instance, 20 KeV, $4 \times 10^{15}$ cm$^{-2}$ from above to convert the NMOS forming region 4a of the polysilicon gate film 4 into an n-type. Then, the first resist mask 5 is exfoliated and the exfoliated portion is washed.

It should be noted that an n-type formation pattern data (a polysilicon n-type formation resist pattern in FIG. 6) to convert the polysilicon film 4 into an n-type while covering the first resist mask 5 can be created only by shifting an n-well data and thus the automatic creation can be easily achieved.

Figure 4B:
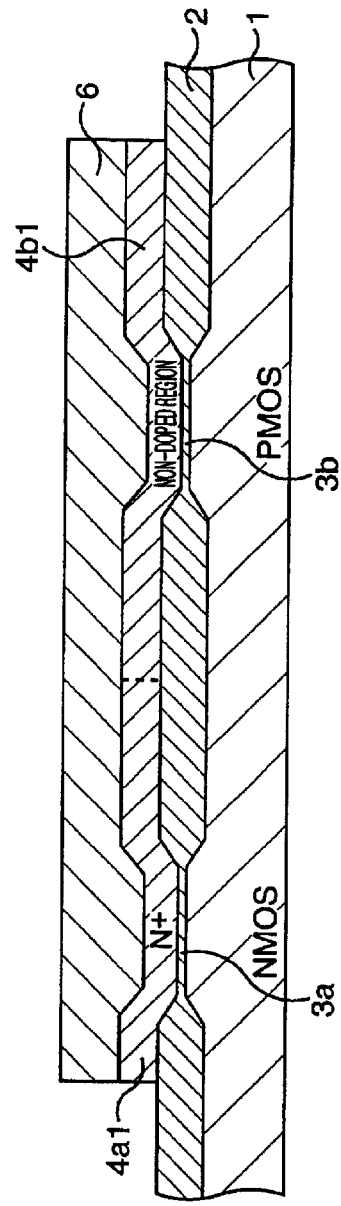

Next, as shown in FIG. 4B, a gate forming region of the polysilicon film 4 is covered with a second resist mask 6, and the polysilicon film 4 is patterned to form the gate electrode forming layers 4a1 and 4b1. Then, the second resist mask 6 is exfoliated and washed.

Figure 4C:
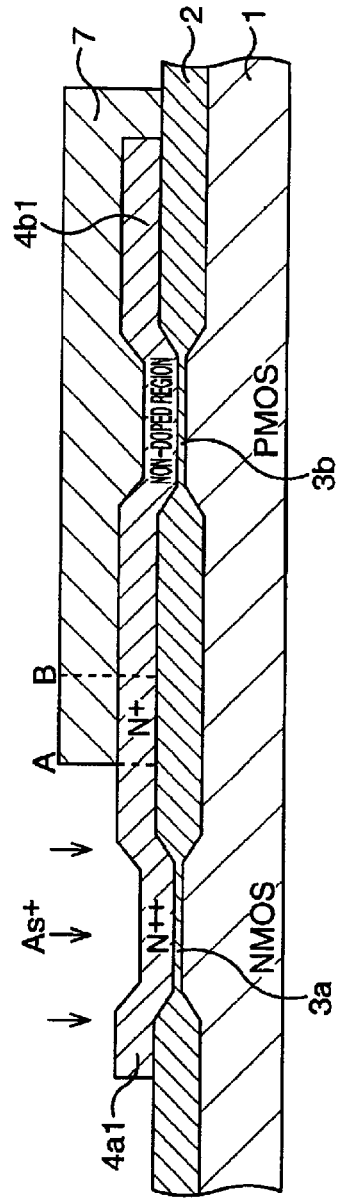

Next, as shown in FIG. 4C, in order to form an LDD in the NMOS forming region, a non-doped region 4b1 and a partial region of the n-type forming region 4a1 are covered with a third resist mask 7 so as to include the non-doped region of the gate electrode forming layers 4a1 and 4b1, and a boundary portion between a non-doped region 4b1 and an n-type forming region 4a1.

More concretely, an NMOSLDD ion implantation window to form an LDD in the NMOS forming region (an end A of the third resist mask 7 on the NMOS forming region side) is arranged to position between an n-type formation window of the gate electrode (an end B of the first resist mask 5 on the NMOS forming region side) and the NMOS gate electrode (an end of the polysilicon film 4 positioned on the gate insulation film 3a on the PMOS forming region side).

Then, an arsenic ion (As$^+$) is injected from above under the condition of, for instance, 10 KeV, $3 \times 10^{14}$ cm$^{-2}$ to perform ion implantation for the LDD of an NMOS transistor.

The LDD implantation window data (the NMOSLDD resist pattern in FIG. 6) to form the above-described NMOSLDD ion implantation window can be automatically created by shifting the n-type pattern data of the gate electrode (the polysilicon n-type formation resist pattern in FIG. 6).

Then, the third resist mask 7 is exfoliated and the exfoliated portion is washed.

Next, as shown in FIG. 5A, after formation of side wall spacers 8a and 8b on the side walls of the gate electrode forming layers 4a1 and 4b1, in order to form source and drain regions in the NMOS forming region, a non-doped region 4b1 and a partial region of an n-type forming region 4a1 are covered with a fourth resist mask 9 as a fourth mask layer so as to include a boundary portion between the non-doped region 4b1 of the gate electrode forming layers 4a1 and 4b1 and the n-type formation region 4a1.

More concretely, an end A of a fourth resist mask 9 on the NMOS forming region side is managed to position between an end of the n-type formation window of the gate electrode (the end B of the first resist mask 5 on the NMOS forming region side) and the NMOS gate electrode (an end of the polysilicon film 4 positioned on the gate insulation film 3a on the PMOS forming region side) in a similar manner to the case of NMOSLDD ion implantation described above.

Then, an arsenic ion (As$^+$) as a fourth impurity is injected from above under the condition of, for instance, 40 KeV, $2 \times 10^{15}$ cm$^{-2}$ to form a source region and drain region in high concentration (an NMOS LDD S/D24 in FIG. 6 and FIG. 7) in the NMOS forming region of the semiconductor substrate.

The difference between the ion concentration N$^+$ in a region covered with the fourth resist mask 9 and the ion concentration N$^{++}$ in a region not covered with, in the n-type region 4a1 of the gate electrode forming layers 4a1 and 4b1 is about $1.5 \times 10^{20}$ cm$^{-3}$.

The NMOS source and drain formation implantation window data (the NMOS S/D resist pattern in FIG. 6) to form a source and drain regions in the NMOS forming region is the same as the LDD implantation window data (the NMOSLDD resist pattern in FIG. 6) to form the NMOSLDD ion implantation window.

Then, the fourth resist mask 9 is exfoliated and the exfoliated portion is washed.

Next, as shown in FIG. 5B, the non-doped region 4b1 excluding a region E to form the PMOS gate electrode and the n-type forming region 4a1 are covered with a sixth resist mask 21 as a third mask layer.

More concretely, an end D of the sixth resist mask 21 on the PMOS forming region side is arranged to position between an end B of the n-type formation window of the gate electrode and a PMOS gate electrode (an end of the polysilicon film 4 positioned on the gate insulation film 3b on the NMOS forming region side).

At this time, the distance between the n-type formation window of the gate electrode (the end B of the first resist mask) and the PMOS source and drain ion implantation window (the end D of the sixth resist mask 21) is preferably about 0.3 $\mu$m in the case of, for instance, 0.25 $\mu$m device.

Then, a boron ion ($B^+$) as a third impurity is injected from above under the condition of, for instance, 7 KeV, $2\times10^{15}$ $cm^{-2}$. Through this process, a region E to form the PMOS gate electrode is converted into a p-type (hereinafter, a p-type formed non-doped region is expressed as a p-type forming region) and at the same time a source region and a drain region in high concentration (PMOS LDD source and drain 25 in FIG. 6 and FIG. 7) are formed in the PMOS forming region of the semiconductor substrate.

It should be noted that the PMOS source and drain formation implantation window data (the PMOS source and drain resist pattern in FIG. 7) to form the source and drain regions in the above-described PMOS forming region can be automatically created by shifting the n-type formation pattern data of the gate electrode (the polysilicon n-type formation resist pattern in FIG. 7), similar to the above-described LDD implantation window data.

Next, as shown in FIG. 5C, an ion-injected impurity is activated by heating an element forming region 1 of the semiconductor substrate. Then, silicide 22 is formed in the gate electrode, and the source and drain regions using a high melting point metal.

At this time, since carbide is driven into the surface of the polysilicon film positioned at an end A of the fourth resist mask 9 by implantation of an arsenic ion ($As^+$) shown in FIG. 5A, silicide 22 is not formed on this portion.

However, also in the method according to the present embodiment, a silicide non-forming region 23 where the silicide 22 is not formed is formed in the vicinity of the central portion of the n-type forming region 4a1 of the gate electrode forming layers 4a1 and 4b1.

Accordingly, a silicide non-forming region 23 can be arranged not to overlap with a pn junction of the gate electrode forming layers 4a1 and 4b1, so that a portion where the above-described silicide is not formed can be connected with polysilicon resistance in concentration of $10^{20}$ $cm^{-3}$.

Thus, also in the present embodiment, since the silicide non-forming region 23 is formed on the n-type forming region 4a1 of the gate electrode forming layers 4a1 and 4b1, so that the silicide non-forming region 23 does not overlap with the pn junction of the gate electrode forming layers 4a1 and 4b1, and the silicide film 22 is formed on the pn junction, a parasitic diode consisting of the pn junction is not formed on the gate electrode, which prevents the silicide non-forming region 23 from increasing in resistance.

Owing to this structure, such a process as in the prior art to form a silicon oxide film on the polysilicon film is not required, and a semiconductor device in a dual gate structure can be manufactured at a lower cost than the cost required in the prior art.

In addition, since the necessity of forming the silicon oxide film disappears, the ion implantation energy needs not to be large. Accordingly, the semiconductor device of the present embodiment can be made finer than the semiconductor device in the prior dual structure.

Furthermore, in the semiconductor device according to the present embodiment, when the gate electrode forming layers 4a1 and 4b1 are converted into a p-type, since the sixth resist pattern 21 is formed so as to cover a portion of the non-doped region 4b, the PMOS forming region can be converted into a p-type without a boron ion ($B^+$) being injected into the n-type forming region 4a.

Accordingly, in the method for manufacturing the semiconductor device according to the present embodiment, as in the first embodiment, it has also an advantageous effect in such that the implantation concentration of the boron ion ($B^+$) is not required to be lower than the concentration of the arsenic ion ($As^+$) injected to form an n-type forming region 4a1.

It should be noted that although, in the above-described first and second embodiments, a phosphorus ion is used as the first impurity, and arsenic ions are used as the second and fourth impurities, the first impurity and the second impurity are not limited to these. Any substance will be acceptable provided that the mass of the element composing the first impurity is smaller than the mass of the element composing the second impurity.

Third Embodiment

A third embodiment of the semiconductor device of the present invention and a manufacturing method thereof will be explained next.

The first and second embodiments are the technology to remove unfavorable influences due to the silicide non-forming region accompanied by manufacturing of the NMOS transistor among the CMOS transistors in a dual gate structure. However, in the present embodiment, a technology to remove unfavorable influences due to the silicide non-forming region accompanied by manufacturing of the PMOS transistor will be explained.

FIG. 8A to FIG. 10B are diagrammatic sectional views showing a manufacturing method of a semiconductor device according to the present embodiment in the order of its processes.

As shown in FIG. 8A, after forming a gate insulation film made of, for instance, $SiO_2$ film, using a thermal oxidation method or the like on an element forming region 31 of a semiconductor substrate, a field insulation film 32 is formed in an element separation region using a LOCOS method or the like. Through the process, a gate insulation film 33a in an NMOS forming region, and a gate insulation film 33b in a PMOS forming region separated by the field insulation film 32 are formed.

Then, a polysilicon film 34 is laminated on the gate insulation films 33a and 33b, and the field insulation film 32 by a method such as pytolysis of $SiH_4$ gas in a nitrogen gas atmosphere.

Then, an n-type formation window of the gate electrode is formed by covering a PMOS forming region 34b of the polysilicon film 34 with a seventh resist mask 35 as a first mask layer, and a phosphorus ion ($P^+$) as a first impurity is injected under the condition of, for instance, 15 KeV, $4 \times 10^{15}$ cm$^{-2}$ from above.

Through this process, the NMOS forming region 34a of the polysilicon gate film 34 is converted into an n-type in a concentration of about $3.5 \times 10^{20}$ cm$^{-3}$. Then, the seventh resist mask 35 is exfoliated and the exfoliated portion is washed.

It should be noted that an n-type formation pattern data to convert the polysilicon film 34 into an n-type by covering the seventh resist mask 35 can be created only by shifting n-well data so that it can be automatically created with ease.

Next, as shown in FIG. 8B, an NMOS forming region 34a of an n-type formed polysilicon film 34 is covered with an eighth resist mask 36 as a fifth mask layer, and a boron ion (B$^+$) as a fifth impurity is injected under the condition of, for instance, 5 KeV, $4 \times 10^{15}$ cm$^{-2}$ from above.

Through this process, the PMOS forming region 34b of the polysilicon film 34 is converted into a p-type in a concentration of about $3.5 \times 10^{20}$ cm$^{-3}$. Then, the eighth resist mask 36 is exfoliated and the exfoliated portion is washed.

It should be noted that a p-type formation pattern data to convert the polysilicon film 34 into a p-type by covering the eighth resist mask 36 can be created only by shifting p-well data so that it is automatically created with ease.

Next, as shown in FIG. 8C, a gate forming region of the polysilicon film 34 including the NMOS forming region 34a of the polysilicon gate film 34, and the PMOS forming region 34b of the polysilicon gate film 34 is covered with a ninth resist mask 37, and the polysilicon film 34 is patterned using, for instance, photolithography and dry etching to form a gate electrode forming layers 34a1 and 34b1. Then, the ninth resist mask 37 is exfoliated and washed.

Figure 9A:
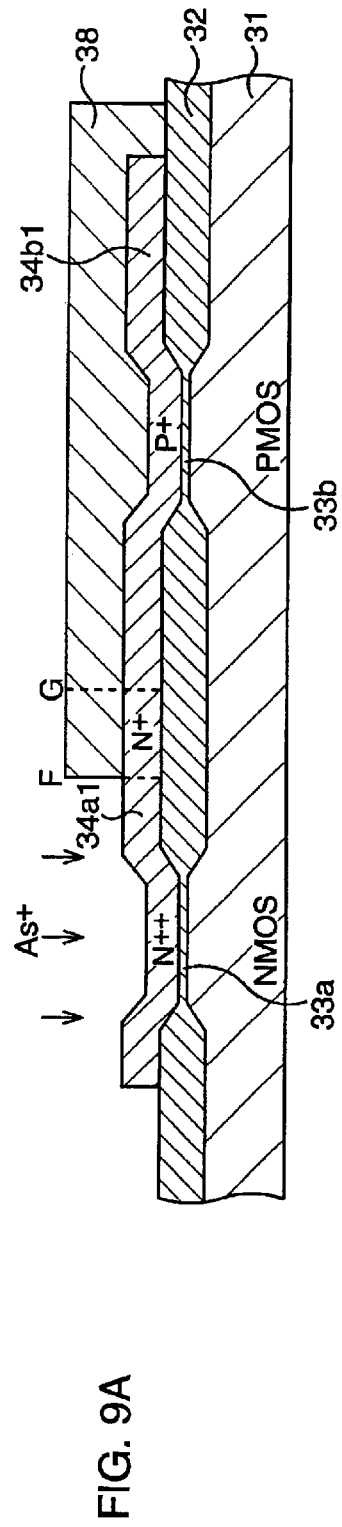
FIGS. 9A, 9B and 9C indicate the third embodiment of the present invention and are diagrammatic sectional views showing a manufacturing method of the semiconductor device following to the processes in FIGS. 8A, 8B and 8C in the order of its processes.

Next, as shown in FIG. 9A, in order to form an LDD in the NMOS forming region, the p-type forming region 34b1 and a partial region of the n-type forming region 34a1 including a boundary region between 34a1 and 34b1 are covered with a tenth resist mask 38 as a second mask layer.

More concretely, an NMOSLDD ion implantation window to form an LDD in the NMOS forming region (an end F of the tenth resist mask 38 on the NMOS forming region side) is arranged to position between an n-type formation window of the gate electrode (an end G of the seventh resist mask 35 on the NMOS forming region side) and the NMOS gate electrode (an end of the polysilicon film 34 positioned on the gate insulation film 33a on the PMOS forming region side).

Then, an arsenic ion (As$^+$) as a second impurity is injected from above under the condition of, for instance, 5 KeV, $3 \times 10^{14}$ cm$^{-2}$ to perform ion implantation for LDD of an NMOS transistor.

The reason to use the arsenic ion (As$^+$) for forming the LDD as above is because it is necessary to form a shallow junction in the semiconductor substrate 1. In addition, the use of the arsenic ion (As$^+$) gives an advantage of not only making the ion implantation energy small, but also making the element to be low resistant so that the drive capacity can be improved.

It should be noted that an implantation window data for the LDD to form the above-described NMOSLDD ion implantation window can be automatically created by shifting the n-type formation pattern data of the gate electrode.

Then, the tenth resist mask 38 is exfoliated and the exfoliated portion is washed.

Figure 9B:
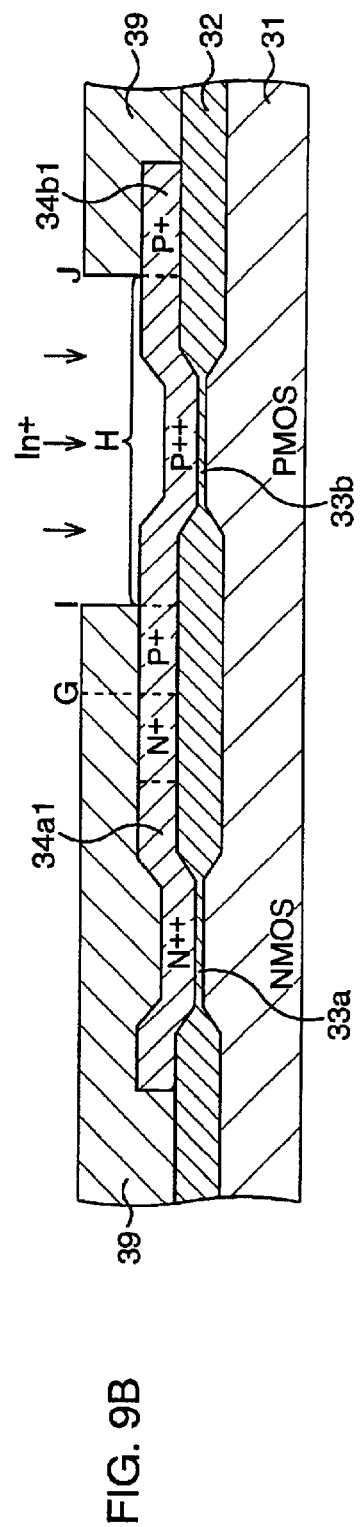

Next, as shown in FIG. 9B, in order to form an LDD in the PMOS forming region, a p-type forming region 34b1 excluding a region H for forming a PMOS gate electrode, and an n-type forming region 34a1 are covered with an eleventh resist mask 39 as a sixth mask layer.

More concretely, a PMOSLDD ion implantation window (an end I of the eleventh resist mask 39 of the NMOS forming region side) on the PMOS forming region side) is arranged to position between a p-type formation window of the gate electrode (an end G of the eighth resist mask 36 on the PMOS forming region side) and the PMOS gate electrode (an end of the polysilicon film 34 positioned on the gate insulation film 33b on the NMOS forming region side).

Then, an indium ion (In$^+$) as a sixth impurity is injected from above under the condition of, for instance, 5 KeV, $3 \times 10^{14}$ cm$^{-2}$ to perform ion implantation for LDD of the PMOS transistor.

The reason to use the indium ion (In$^+$) for forming the LDD as above is because it is necessary to form a shallow junction in the semiconductor substrate 1. In addition, the use of the indium ion (In$^+$) gives an advantage of not only making the ion implantation energy low, but also making the element to be low resistant so that the drive capacity can be improved.

It should be noted that an LDD implantation window data to form the above-described PMOSLDD ion implantation window can be automatically created by shifting the p-type formation pattern data of the gate electrode.

Then, the eleventh resist mask 39 is exfoliated and the exfoliated portion is washed.

Figure 9C:
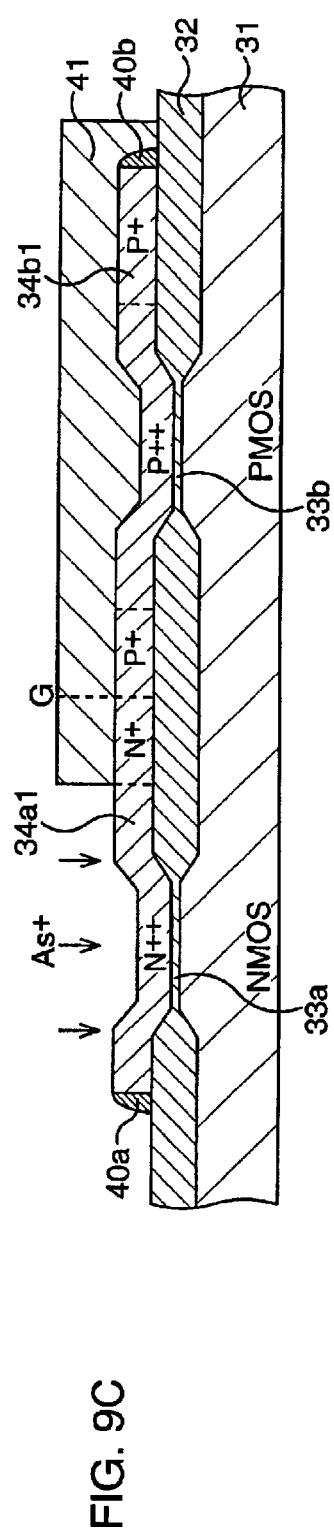

Next, as shown in FIG. 9C, after covering the top faces and side faces of the gate electrode forming layers 34a1 and 34b1 to form an insulation film, anisotropy etching and the like are applied to form side wall spacers 40a and 40b on side walls of the gate electrode forming layer 34a1 and 34b1.

Then, the p-type forming region 34b1 of the gate electrode forming layers 34a1 and 34b1, a partial region of an n-type forming region 34a1 including a boundary region between 34a1 and 34b1 and the side wall spacer 40b are covered with the twelfth resist mask 41 as a fourth mask layer.

More concretely, an end E of the twelfth resist mask 41 on the NMOS forming region side is managed to position between an n-type formation window of the gate electrode (an end F of the seventh resist mask 35 on the NMOS forming region side) and the NMOS gate electrode (an end of the polysilicon film 34 positioned on the gate insulation film 33b on the NMOS forming region side) in a similar manner to the case of NMOSLDD ion implantation described above.

At this time, the distance between the n-type formation window of the gate electrode (the end F of the seventh resist mask 5) and the NMOS source and drain formation ion implantation window (the end E of the twelfth resist mask 41) is preferably about 0.3 µm in the case of, for instance, 0.25 µm device.

Then, an arsenic ion (As$^+$) is injected from above under the condition of, for instance, 15 KeV, $2 \times 10^{15}$ cm$^{-2}$ to form a source region and a drain region in high concentration in the NMOS forming region of the semiconductor substrate (not shown).

The reason of using an arsenic ion (As$^+$) to form the source region and the drain region as above is because the ion implantation energy required can be small, and the element can be made low resistant so that the drive capacity can be improved.

Thus, the difference between the ion concentration N⁺ in a region covered with the twelfth resist mask 41 and the ion concentration N⁺⁺ in a region not covered with, in the n-type forming region 34a1 of the gate electrode forming layers 34a1 and 34b1 is about $2\times10^{20}$ cm$^{-3}$.

The NMOS source and drain formation implantation window data to form source and drain regions in the NMOS forming region is the same as the LDD implantation window data to form the above-described NMOSLDD ion implantation window.

Then, the twelfth resist mask 41 is exfoliated and the exfoliated portion is washed.

Next, as shown in FIG. 10A, a p-type forming region 34b1 excluding a region G to form a PMOS gate electrode, and an n-type forming region 34a1 are covered with a thirteenth resist mask 42 as a third mask layer.

More concretely, an end I of the thirteenth resist mask 42 of the NMOS forming region side on the PMOS forming region side is managed to position between a p-type formation window of the gate electrode (an end G of the eighth resist mask 36 on the PMOS forming region side) and the PMOS gate electrode (an end of the polysilicon film 34 positioned on the gate insulation film 33b on the NMOS forming region side).

Then, a boron ion (B⁺) as a third impurity is injected from above under the condition of, for instance, 5 KeV, $2\times10^{15}$ cm$^{-2}$. Through this process, a region G for forming a PMOS gate electrode is converted into a p-type more, and at the same time, a source region and a drain region in high concentration are formed in the PMOS forming region of the semiconductor substrate (not shown).

Thus, the difference between the ion concentration P⁺ in a region covered with the thirteenth resist mask 42 and the ion concentration P⁺⁺ in a region not covered with, in the p-type forming region 34b1 of the gate electrode forming layers 34a1 and 34b1 is about $2\times10^{20}$ cm$^{-3}$.

It should be noted that an implantation window data for PMOS source and drain formation to form source and drain regions in the PMOS forming region can be also automatically created by shifting the p-type formation pattern data of the gate electrode.

Next, as shown in FIG. 10B, an ion-injected impurity is activated by heating an element forming region 31 of the semiconductor substrate. Then, silicide 43 is formed in the gate electrode, and the source and drain regions using a high melting point metal.

At this time, since carbide is driven into the surface of the polysilicon film 34 positioned at an end E of the tenth resist masks 38 and the twelfth resist mask 41 by implantation of arsenic ion (As⁺) shown in FIG. 9A and FIG. 9C, silicide 43 is not formed on this portion.

Since carbide is driven also into the surface of the polysilicon film 34 positioned at ends H and J of the eleventh resist mask 39 by implantation of an indium ion (In⁺) shown in FIG. 9B, silicide 43 is not formed on this portion.

However, according to the manufacturing method in the present embodiment, a silicide non-forming regions 44a to 44c where the silicide 43 is not formed is formed in the vicinity of the central portion of n-type forming region 34a1 or in the vicinity of the central portion of the p-type forming region 34b1 of the gate electrode forming layers 34a1 and 34b1.

Accordingly, a silicide non-forming region 43 can be arranged not to overlap with a pn junction of the gate electrode forming layers 34a1 and 34b1, so that a portion where the silicide non-forming region 43 is formed can be connected with polysilicon resistance of $10^{20}$ cm$^{-3}$ in concentration.

Thus, in the present embodiment, since the silicide non-forming regions 44a to 44c do not overlap with a pn junction of the gate electrode forming regions 34a1 and 34b1, so that a silicide film 43 is formed on the pn junction, a parasitic diode consisting of the pn junction is not formed on the gate electrode in the PMOS transistor in a dual gate structure, which prevents resistance in the silicide non-forming region 44 from increasing.

It should be noted that although, in the present embodiment, a phosphorus ion is used as a first impurity, and arsenic ions are used as second and fourth impurities, the first impurity, and the second and fourth impurities are not limited to these. Any substance will be acceptable provided that the mass of the element composing the first impurity is smaller than the mass of the element composing the second and fourth impurities.

Although boron ions are used as the third and fifth impurities, and an indium ion is used as the sixth impurity, the third and fifth impurities and the sixth impurity are not limited to these. Any substance will be acceptable provided that the mass of the element composing the third and fifth impurities is smaller than the mass of the element composing the sixth impurity.

Fourth Embodiment

A fourth embodiment of the semiconductor device of the present invention and a manufacturing method thereof will be explained next.

FIGS. 11A, 11B, and 11C and FIGS. 12A, 12B, and 12C are diagrammatic sectional views showing a manufacturing method of a semiconductor device according to the present embodiment in the order of its processes.

Figure 11A:
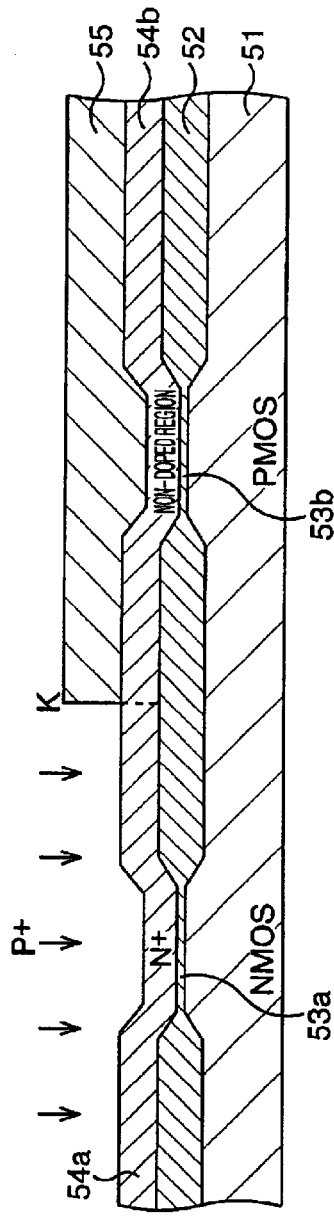
FIGS. 11A, 11B and 11C indicate a fourth embodiment of the present invention and are diagrammatic sectional views showing a manufacturing method of a semiconductor device in the order of its processes.

As shown in FIG. 11A, after forming a gate insulation film on an element forming region 51 of a semiconductor substrate, a field insulation film 52 is formed so that a gate insulation film 53a of an NMOS forming region and a gate insulation film 53b of a PMOS forming region are separated from each other.

Then, after laminating a polysilicon film 54 on the gate insulation films 53a and 53b, and the field insulation film 52, a PMOS forming region 54b of the polysilicon film 54 is covered with a fourteenth resist mask 55 as a first mask layer to form an n-type formation window of the gate electrode.

Then, a phosphorus ion (P⁺) as a first impurity is injected under the condition of, for instance, 20 KeV, $4\times10^{15}$ cm$^{-2}$ from above to convert an NMOS forming region 54a of the polysilicon gate film 54 into an n-type. Then, the fourteenth resist mask 55 is exfoliated and the exfoliated portion is washed.

Figure 11B:
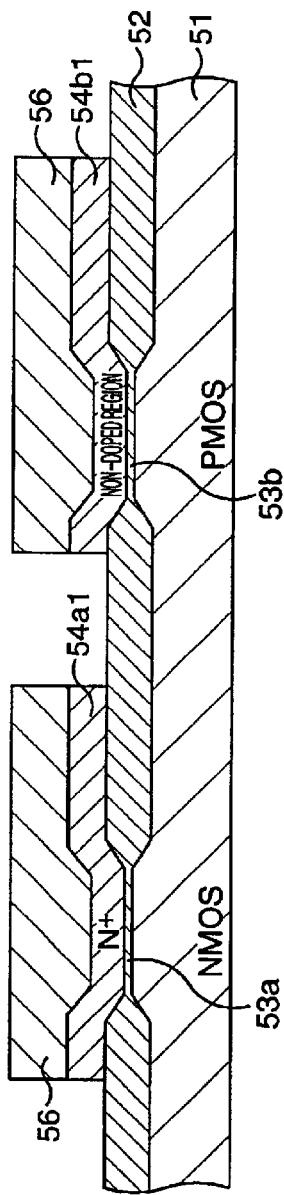
Figure 11C:
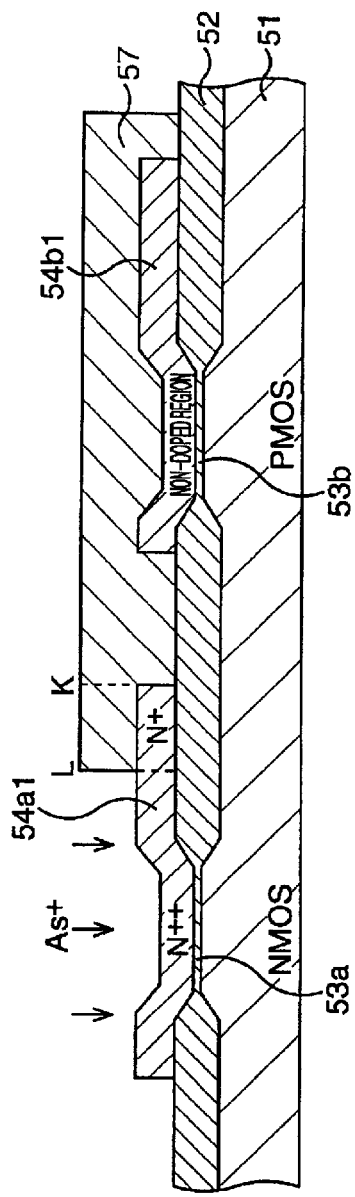

Next, as shown in FIG. 11B, a gate forming region of the polysilicon film 54 is covered with a fifteenth resist mask 56, and the polysilicon film 54 is patterned to form a NMOS gate electrode forming layer 54a1 and a PMOS gate electrode forming layer 54b1. Then, the fifteenth resist mask 56 is exfoliated and the exfoliated portion is washed.

Next, as shown in FIG. 1C, in order to form an LDD in the NMOS forming region, a PMOS gate electrode forming layer 54b1 and a portion of an NMOS gate electrode forming layer 54a1 on the PMOS gate electrode forming layer 54b1 side are covered with a sixteenth resist mask 57 as a second mask layer.

More concretely, an NMOSLDD ion implantation window (an end L of the sixteenth resist mask 57 on the NMOS forming region side) to form the LDD in the NMOS forming region is arranged to position between the n-type formation window of the gate electrode (an end K of the fourteenth resist mask 55 on the NMOS forming region side) and the NMOS gate electrode (an end of the polysilicon film 54 positioned on the gate insulation film 53a on the PMOS forming region side).

Then, an arsenic ion (As$^+$) as a second impurity is injected under the condition of, for instance, 10 KeV, 3×10$^{14}$ cm$^{-2}$ from above to perform ion implantation for an LDD of the NMOS transistor.

Then, the sixteenth resist mask 57 is exfoliated and the exfoliated portion is washed.

Figure 12A:
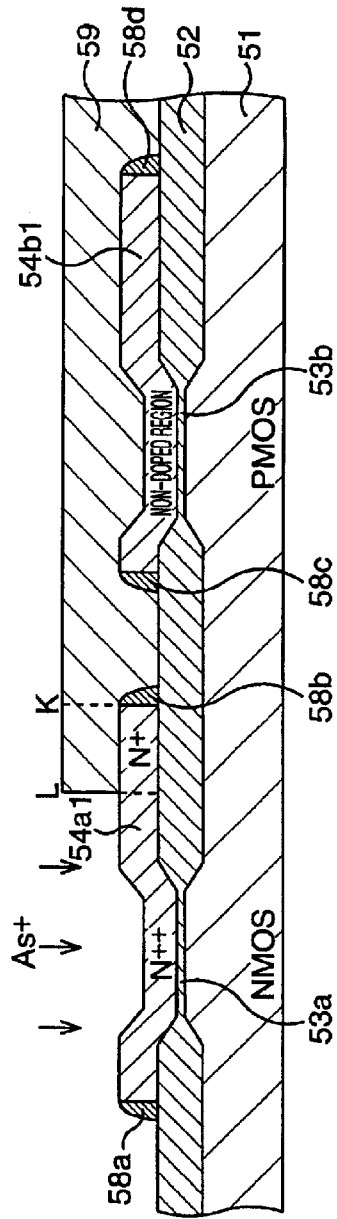
FIGS. 12A, 12B and 12C indicate the fourth embodiment of the present invention and are diagrammatic sectional views showing a manufacturing method of the semiconductor device following to the processes in FIGS. 11A, 11B and 11C in the order of its processes.

Next, as shown in FIG. 12A, after forming side wall spacers 58a to 58d on side walls of an NMOS gate electrode forming layer 54a1 and a PMOS gate electrode forming layer 54b1, a seventeenth resist mask 59 as a fourth mask layer is formed so as to cover the PMOS gate electrode forming layer 54b1 and a partial region of the NMOS gate electrode forming layer 54a1 on the PMOS forming region side from above.

More concretely, an end L of the seventeenth resist mask 59 on the NMOS forming region side is arranged to position between an n-type formation window of the gate electrode (an end K of the fourteenth resist mask 55 on the NMOS forming region side) and an NMOS gate electrode (an end of the polysilicon film 54 positioned on the gate insulation film 53a on the PMOS forming region side) in a similar manner to the case of NMOSLDD ion implantation described above.

Then, an arsenic ion (As$^+$) as an fourth impurity is injected from above under the condition of, for instance, 40 KeV, 2×10$^{15}$ cm$^{-2}$ to form a source region and a drain region in high concentration in the NMOS forming region of the semiconductor substrate (not shown).

Thus, the difference between the ion concentration N$^+$ in a region covered with the seventeenth resist mask 59 and the ion concentration N$^{++}$ in a region not covered with, in the NMOS gate electrode forming layer 54a1 is about 1.5×10$^{20}$ cm$^{-3}$.

Then, the seventeenth resist mask 59 is exfoliated and the exfoliated portion is washed.

Figure 12B:
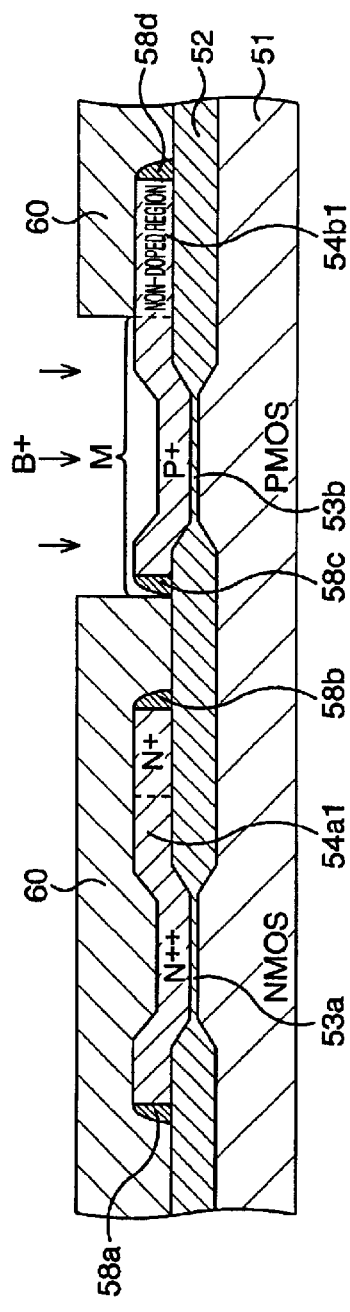

Next, as shown in FIG. 12B, a region excluding a region M for forming the PMOS gate electrode is covered with an eighteenth resist mask 60 as a third mask layer.

Then, a boron ion (B$^+$) as a third impurity is injected from above under the condition of, for instance, 7 KeV, 2×10$^{15}$ cm$^{-2}$. Through this process, a PMOS gate electrode forming layer 54b1 for forming the PMOS gate electrode is converted into a p-type, and at the same time, a source region and a drain region in high concentration are formed in the PMOS forming region of the semiconductor substrate (not shown).

Figure 12C:
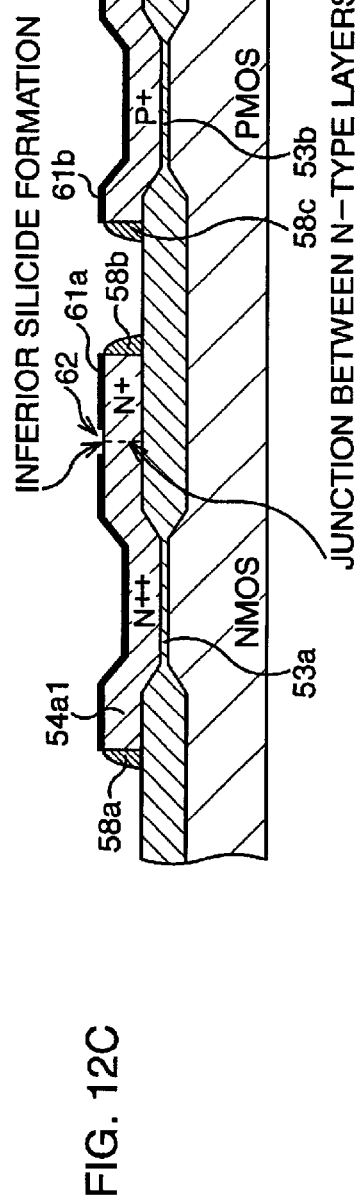
Figure 13A:
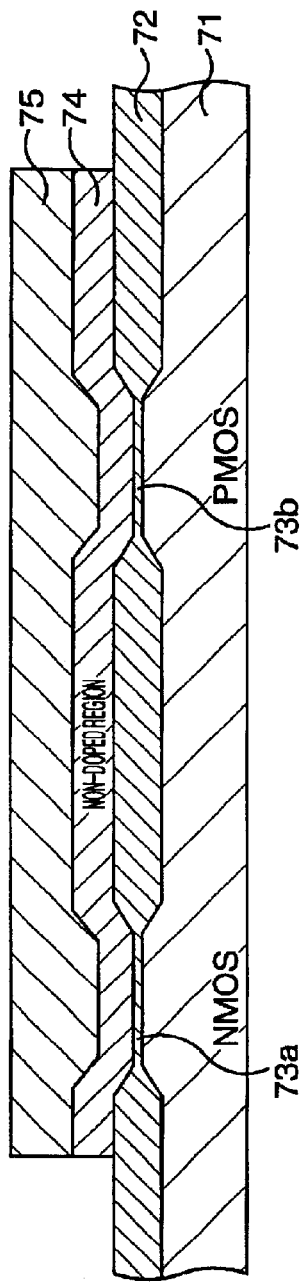
FIGS. 13A, 13B and 13C indicate a prior art and are diagrammatic sectional views showing a manufacturing method of a semiconductor device in the order of its processes.
Figure 13B:
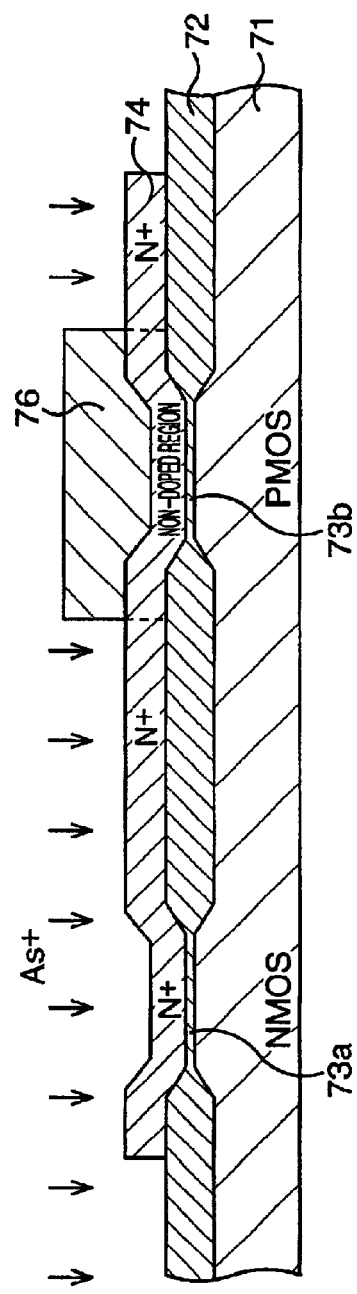
Figure 13C:
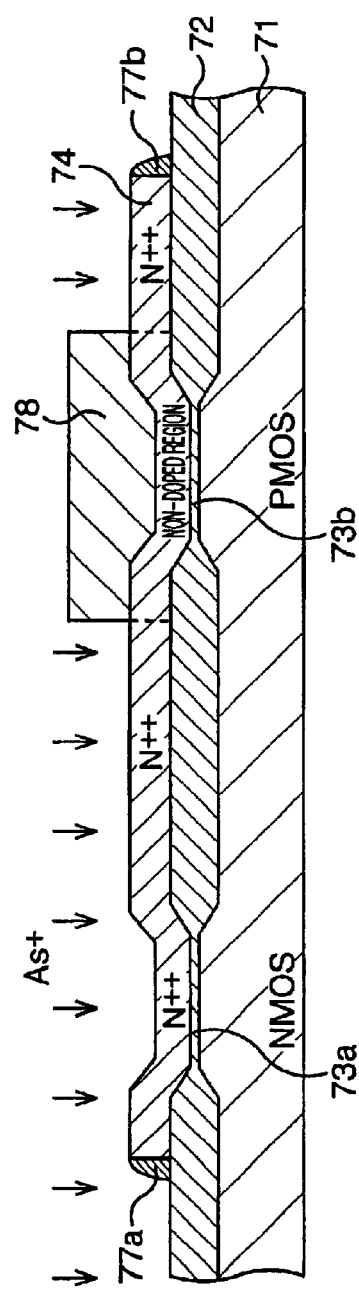
Figure 14A:
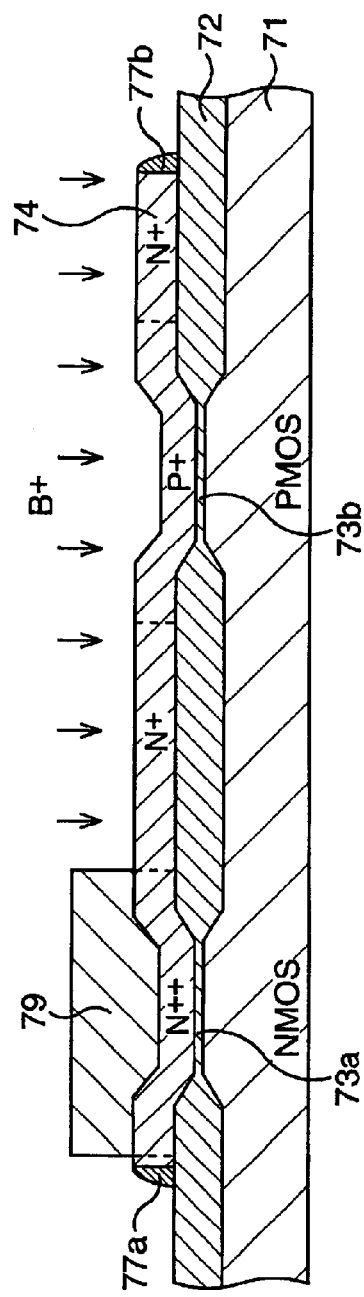
FIGS. 14A and 14B indicate the prior art and are diagrammatic sectional views showing a manufacturing method of the semiconductor device following to the processes in FIGS. 13A, 13B and 13C in the order of its processes.
Figure 14B:
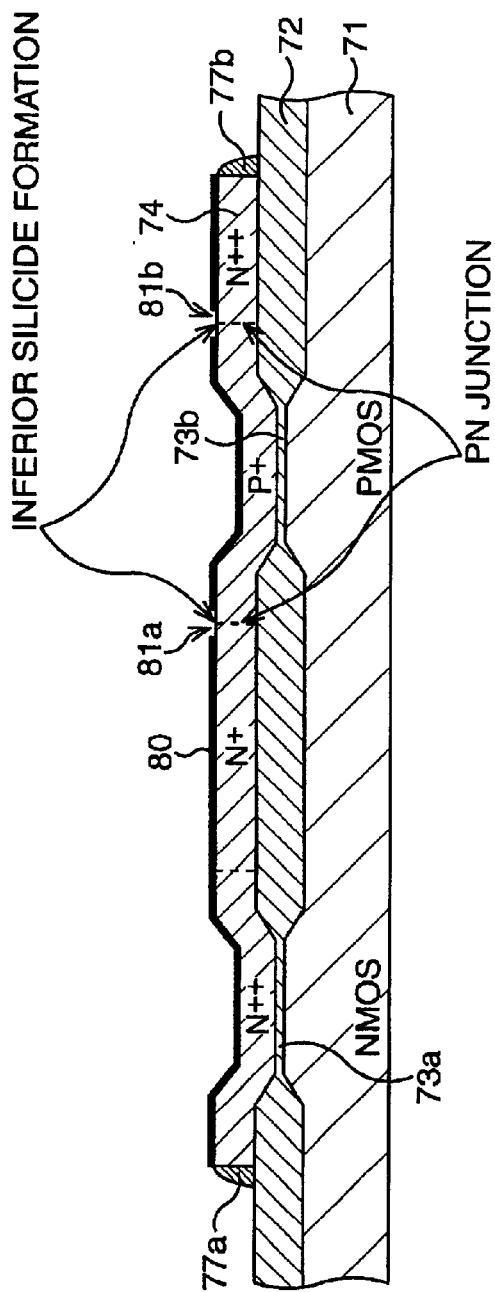

Next, as shown in FIG. 12C, an ion-injected impurity is activated by heating an element forming region 51 of the semiconductor substrate. Then, silicides 61a and 61b are formed in the gate electrode and the source and drain regions using a high melting point metal.

At this time, since carbide is driven into the surface of the polysilicon film positioned at the end M of the seventeenth resist mask 57 by the arsenic ion (As$^+$) injection shown in FIG. 12A, the silicide 61a is not formed in this portion.

However, according to the method in the present embodiment, a silicide non-forming region 62 where the silicide 61a is not formed is formed on the NMOS gate electrode forming layer 54a1.

Accordingly, a silicide non-forming region 62 can be arranged not to overlap with a pn junction of the gate electrode forming layers 54a1 and 54b1, and a portion where the silicide non-forming region 62 is formed can be connected with polysilicon resistance of 10$^{20}$ cm$^{-3}$ in concentration.

Thus, even in a semiconductor device in which a NMOS transistor and a PMOS transistor are not formed with the same polysilicon, a silicide non-forming region 62 can be formed on an n-type forming region (NMOS gate electrode forming layer 54a1), similarly to the case of the CMOS transistor in the first to third embodiments of the present embodiment, and the silicide non-forming region 62 is not to position on the pn junction.

The formation of a parasitic diode consisting of the pn junction on the gate electrode can be prevented, and resistance in the silicide non-forming region 62 can be prevented from increasing.

In addition, in the PMOS transistor in the present embodiment, the silicide 61b can be perfectly formed on the PMOS gate electrode forming layer 54b1. Accordingly, unfavorable influence on the operation of the semiconductor device due to the silicide formation can be completely eliminated.

It should be noted that, even in the present embodiment, although a phosphorus ion is used as the first impurity and an arsenic ion is used as the second and fourth impurities, similarly to the first and second embodiments, the first impurity and the second impurity are not limited to these, and any substance will be acceptable provided that the mass of the element composing the first impurity is smaller than the mass of the element composing the second impurity.

Furthermore, in the above-described first and fourth embodiments, although a polysilicon film is used as a material for the gate electrode, the material for the gate electrode is not limited to the polysilicon film, and any material will be acceptable provided that it is a semiconductor film.

Still further, the conditions of the ion implantation for a phosphorus ion, a boron ion, and an arsenic ion are not limited to the values described in the first to fourth embodiments. That is, it is acceptable for a phosphorus ion to implant under the condition of 20 keV, 4×10$^{15}$ cm$^{-2}$ or less, for a boron ion under the condition of 7 keV, 4×10$^{15}$ cm$^{-2}$ or less, and for an arsenic ion under the condition of 10 keV, 6×10$^{13}$ cm$^{-2}$ or more.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

As explained above, according to the present invention, the same conductive-type semiconductor films formed above the semiconductor substrate are connected while having two or more differences in concentration along the surface of the semiconductor substrate, and a non-forming region of the silicide film can be formed on the region having the difference in concentration. This makes it possible to form the silicide non-forming region, formed on the semiconductor film on the same conductive-type semiconductor films, and a parasitic diode consisting of a pn junction is prevented from being formed on the gate electrode. As a result, cost reduction and fine structure formation can be realized while restraining unfavorable influence due to formation of silicide on the semiconductor film.

What is claimed is:

1. A semiconductor device, comprising:
a first conductive-type semiconductor film formed above a semiconductor substrate; and a silicide film formed on said semiconductor film,
wherein the first conductive-type semiconductor film has two or more regions having different concentrations of impurities along a surface of said semiconductor substrate, said regions comprising at least a region of relatively high concentration and a region of the next highest concentration or relatively low concentration, said regions being in electrical connection at vertical interface therebetween that extends vertically completely through said conductive-type semiconductor film,
and wherein said silicide film is not completely formed over at least one of the vertical interfaces of the regions.

2. The semiconductor device according to claim 1, wherein the silicide film is not formed over an interface between the region of said semiconductor film having the highest concentration and the region of said semiconductor film having the next highest concentration.

3. The semiconductor device according to claim 1, wherein an impurity existing in the region of relatively high concentration on said semiconductor film is heavier in mass than an impurity existing in the region of relatively low concentration in the semiconductor film.

4. The semiconductor device according to claim 1, further comprising a second conductive-type semiconductor film different from said first conductive-type semiconductor film, wherein the region of relatively low concentration in said first conductive-type semiconductor film is in electrical connection with said second conductive-type semiconductor film.

5. The semiconductor device according to claim 4, wherein the region of relatively low concentration in said first conductive-type semiconductor film and said second conductive-type semiconductor film are in electrical connection with each other along the surface of said semiconductor substrate.

6. The semiconductor device according to claim 4, wherein an arsenic ion exists in the region of relatively high concentration in said first conductive-type semiconductor film.

7. The semiconductor device, according to claim 4, wherein a phosphorus ion exists in the region of relatively low concentration in said first conductive-type semiconductor film.

8. The semiconductor device according to claim 1, further comprising a second conductive-type semiconductor film different from said first conductive-type semiconductor; and still further comprising a non-doped semiconductor film in which an impurity is not doped, wherein said non-doped semiconductor film is sandwiched between the region of relatively low concentration in said first conductive-type semiconductor film and said second conductive-type semiconductor film along the surface of said semiconductor substrate.

9. The semiconductor device according to claim 1, said further comprising;
a second conductive-type semiconductor film different from said first conductive-type semiconductor film, wherein said second conductive-type semiconductor film has two or more regions having differences in concentration of impurities, said regions comprising at least a region of relatively high concentration and a region of the next highest concentration, said regions being in electrical connection at a vertical interface therebetween that extends vertically completely through said second conductive-type semiconductor layer;
wherein the region of relativity low concentration in said first conductive-type semiconductor film and the region of relatively low concentration in said second conductive-type semiconductor film are in electrical connection with each other.

10. The semiconductor device according to claim 9, wherein the region of relatively low concentration in said first conductive-type semiconductor film and the region of relatively low concentration in said second conductive-type semiconductor film are in electrical connection with each other along the surface of said semiconductor substrate.

11. The semiconductor device according to claim 9, wherein an indium ion exists in the region of relatively high concentration in said second conductive-type semiconductor film.

12. The semiconductor device according to claim 9, wherein a boron ion exists in the region of relatively low concentration in said second conductive-type semiconductor film.

13. The semiconductor device according to claim 1, wherein the semiconductor device comprises;
an insulation film formed on the surface of said semiconductor substrate and
diffusion layers formed in said semiconductor substrate to sandwich a lower region of the first conductive-type semiconductor film,
and wherein said semiconductor device includes a transistor in which said semiconductor film serves as a gate, said insulation film serves as a gate insulation film, and said diffusion layers serve as a source and a drain.

14. The semiconductor device according to claim 13, wherein said semiconductor device includes a CMOS transistor, wherein said CMOS transistor comprises: a first MOS transistor in which said first conductive-type semiconductor film serves as a gate, said insulation film serves as a gate insulation film, and said diffusion layers formed to sandwich the lower region of the first conductive-type semiconductor film serve as a source, and a drain; and a second MOS transistor in which said second conductive-type semiconductor film serves as a gate, said insulation film serves as a gate insulation film, and said diffusion layers formed to sandwich the lower region of the second conductive-type semiconductor film serve as a source and a drain.

15. The semiconductor device according in claim 14, further comprising a boundary region between said first MOS transistor and said second MOS transistor, wherein the thickness of the insulation film formed on the boundary region between said first MOS transistor and said second MOS transistor is thicker than the thickness of other regions of the insulation film.

16. The semiconductor device according to claim 14, wherein said diffusion layers include difference in concentration.

17. The semiconductor device according to claim 13, wherein side wall spacers are formed on both sides of said semiconductor film.

18. A semiconductor device, comprising;
a gate semiconductor film formed above a semiconductor substrate in a state that two different conductive-type semiconductor films are connected with each other, wherein at least one of said semiconductor films has two or more regions having difference in concentration of impurities, said regions comprising at least a region of relatively high concentration and a region of the next highest concentration, and a silicide film formed on said gate semiconductor film, wherein said silicide film is formed at least on a junction of said gate semiconductor film;

and wherein said silicide film is not formed over a least one of the regions of different concentration.

19. The semiconductor device according to claim 18, wherein an impurity existing in a region of relatively high concentration in a conductive-type semiconductor film is heavier in mass than the impurity existing in a region of relatively low concentration in the same semiconductor film.

20. The semiconductor device according to claim 18, wherein the difference in concentration is $1.5 \times 10^{20}$ cm$^{-3}$ or more and $2 \times 10^{20}$ cm$^{-3}$ or less.

* * * * *